(12) United States Patent
Ishizu

(10) Patent No.: US 9,715,920 B2
(45) Date of Patent: *Jul. 25, 2017

(54) MEMORY DEVICE, AND SEMICONDUCTOR DEVICE AND ELECTRONIC APPLIANCE INCLUDING THE SAME

(71) Applicant: Semiconductor Energy Laboratory Co., Ltd., Atsugi-shi, Kanagawa-ken (JP)

(72) Inventor: Takahiko Ishizu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/209,833

(22) Filed: Jul. 14, 2016

(65) Prior Publication Data

US 2016/0322096 A1    Nov. 3, 2016

Related U.S. Application Data

(63) Continuation of application No. 14/723,618, filed on May 28, 2015, now Pat. No. 9,406,370.

(30) Foreign Application Priority Data

May 29, 2014    (JP) ................................. 2014-111062

(51) Int. Cl.
*G11C 11/24*    (2006.01)
*G11C 11/406*    (2006.01)
(Continued)

(52) U.S. Cl.
CPC ...... *G11C 11/40615* (2013.01); *G11C 11/404* (2013.01); *G11C 11/405* (2013.01);
(Continued)

(58) Field of Classification Search
CPC ... G11C 11/404; G11C 11/405; G11C 11/406; G11C 11/4074; G11C 11/4091; G11C 11/40615
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Pho M Luu
(74) *Attorney, Agent, or Firm* — Fish & Richardson P.C.

(57) ABSTRACT

A memory device capable of optimizing a refresh cycle is provided. The memory device includes a monitor circuit capable of generating a signal serving as a trigger for a refresh operation. The monitor circuit includes a transistor and a capacitor. The monitor circuit has a function of sensing that a potential retained in the capacitor is lower than a reference potential, a function of generating a first signal and a second signal on the basis of the sensing result, and a function of turning on the transistor in response to the second signal and resetting the potential retained in the capacitor to an initialization state. It is possible to start refresh of a memory cell in response to the first signal.

15 Claims, 23 Drawing Sheets

(51) Int. Cl.
    *G11C 11/405*         (2006.01)
    *H01L 29/78*          (2006.01)
    *G11C 11/404*         (2006.01)
    *G11C 11/4074*       (2006.01)
    *H01L 27/12*          (2006.01)
    *H01L 27/108*         (2006.01)
    *G11C 11/4091*       (2006.01)

(52) U.S. Cl.
    CPC ........ *G11C 11/406* (2013.01); *G11C 11/4074* (2013.01); *G11C 11/4091* (2013.01); *H01L 27/108* (2013.01); *H01L 27/10802* (2013.01); *H01L 27/10805* (2013.01); *H01L 27/1203* (2013.01); *H01L 29/7841* (2013.01); *G11C 2211/4068* (2013.01)

(58) Field of Classification Search
    USPC ................................................ 365/149, 150
    See application file for complete search history.

(56) References Cited

U.S. PATENT DOCUMENTS

| | | | |
|---|---|---|---|
| 6,075,739 A | 6/2000 | Ihara | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,778,457 B1 | 8/2004 | Burgan | |
| 7,002,868 B2 * | 2/2006 | Takahashi ............. | G11C 11/406 365/149 |
| 7,049,190 B2 | 5/2006 | Takeda et al. | |
| 7,054,223 B2 * | 5/2006 | Takahashi ................ | G11C 8/18 365/154 |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,324,399 B2 * | 1/2008 | Jang ...................... | G11C 11/406 365/222 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,031,507 B2 | 10/2011 | Doumae | |
| 8,406,038 B2 | 3/2013 | Saito et al. | |
| 8,482,974 B2 | 7/2013 | Saito et al. | |
| 8,866,719 B2 | 10/2014 | Nishi et al. | |
| 9,001,563 B2 | 4/2015 | Atsumi et al. | |
| 9,159,738 B2 | 10/2015 | Yamauchi | |
| 9,406,370 B2 * | 8/2016 | Ishizu ................... | G11C 11/406 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068172 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0199807 A1 | 8/2011 | Saito et al. | |
| 2011/0280061 A1 | 11/2011 | Saito et al. | |
| 2012/0037972 A1 | 2/2012 | Yoneda | |
| 2012/0039126 A1 | 2/2012 | Saito | |
| 2012/0275214 A1 | 11/2012 | Atsumi et al. | |
| 2015/0262642 A1 | 9/2015 | Koyama | |
| 2015/0348608 A1 | 12/2015 | Matsuzaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-252490 A | 9/1992 |
| JP | 05-251705 A | 9/1993 |
| JP | 08-264794 A | 10/1996 |
| JP | 11-505377 | 5/1999 |

(56) References Cited

FOREIGN PATENT DOCUMENTS

| | | |
|---|---|---|
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-187950 A | 9/2011 |
| JP | 2012-064930 A | 3/2012 |
| JP | 2012-256408 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Syposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1073, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letts), Jul. 31, 2000, vol. 85, No. 5, pp. 1012-1015.

\* cited by examiner

121

122

123

124

Monitor Circuit 101

CMP112

BNK0

- ▨ 50 : Monitor Circuit
- ▦ 60 : Refresh Control Circuit
- ▧ 75 : Sub-row Driver Circuit
- ▩ 76 : Sense Amplifier Portion
- ☐ 81 : Memory Cell Array

150

800

800

800

800

800

800

MEMORY DEVICE, AND SEMICONDUCTOR DEVICE AND ELECTRONIC APPLIANCE INCLUDING THE SAME

CROSS-REFERENCE TO RELATED APPLICATIONS

This application is a continuation of U.S. application Ser. No. 14/723,618, filed May 28, 2015, now U.S. Pat. No. 9,406,370, which claims the benefit of a foreign priority application filed in Japan as Serial No. 2014-111062 on May 29, 2014, both of which are incorporated by reference.

BACKGROUND OF THE INVENTION

1. Field of the Invention

One embodiment of the present invention relates to a memory device including a semiconductor or a semiconductor device, a driving method thereof, a manufacturing method thereof, and the like.

Note that one embodiment of the present invention is not limited to the above technical field. The technical field of one embodiment of the invention disclosed in the specification, the drawings, and the claims (hereinafter referred to as "this specification and the like") relates to an object, a method, or a manufacturing method. Furthermore, one embodiment of the present invention relates to a process, a machine, manufacture, or a composition of matter. Specifically, examples of the technical field of one embodiment of the present invention disclosed in this specification and the like include a semiconductor device, a memory device, a display device, a liquid crystal display device, a light-emitting device, a lighting device, a power storage device, an input device, an imaging device, a method of driving any of them, and a method of manufacturing any of them.

2. Description of the Related Art

In a general dynamic random access memory (DRAM), a memory cell includes one writing transistor (1T) and one capacitor (1C). Such a 1T1C DRAM is a memory capable of retaining data by accumulating charge in the capacitor and thus has no limit on the number of times of writing in principle. As a high-capacity memory device, the DRAM is incorporated in a number of electronic appliances because of writing and reading at relatively high speed and a small number of memory cells, which easily enable high integration. Besides the 1T1C memory cell, a memory cell called a gain cell including two or three transistors is known.

Even when a writing transistor is in an off state, a slight amount of leakage current is generated between a source and a drain; thus, the data is lost within a relatively short time. Therefore, the data needs to be rewritten (refreshed) on a regular cycle (generally once every several tens of milliseconds) in a DRAM.

The use of a transistor in which the channel is formed using an oxide semiconductor (hereinafter may be referred to as an OS transistor) in a 1T1C memory cell and the use of the OS transistor as a writing transistor of a gain cell are proposed. For example, Patent Document 1 discloses that even when power is not supplied, data can be retained in a memory cell for a long period by utilization of a characteristic of an extremely small off-state current of an OS transistor. Furthermore, a circuit which has a function of detecting the timing of refresh of a memory cell including an OS transistor is proposed (e.g., Patent Documents 2 and 3).

REFERENCE

Patent Document

[Patent Document 1] Japanese Published Patent Application No. 2011-187950
[Patent Document 2] Japanese Published Patent Application No. 2012-064930
[Patent Document 3] Japanese Published Patent Application No. 2012-256408

SUMMARY OF THE INVENTION

An object of one embodiment of the present invention is to provide a novel semiconductor device and a method for driving the novel semiconductor device. Another object of one embodiment of the present invention is to provide a semiconductor device with improved reliability and a method for driving the semiconductor device. Another object of one embodiment of the present invention is to provide a memory device capable of reducing power consumption and a method for driving the memory device. Another object of one embodiment of the present invention is to provide a memory device capable of optimizing a refresh cycle and a method for driving the memory device. Another object of one embodiment of the present invention is to provide a memory device capable of performing temperature compensation or a method for driving the memory device.

Note that the description of a plurality of objects does not mutually preclude the existence. One embodiment of the present invention does not necessarily achieve all the objects. Objects other than those listed above are apparent from the description of the specification, drawings, and claims, and also such objects could be an object of one embodiment of the present invention.

A memory device of one embodiment of the present invention includes a memory cell and a first circuit. The first circuit includes a transistor and a capacitor. The first circuit has a function of sensing that a potential retained in the capacitor is lower than a reference potential, a function of generating a first signal and a second signal on the basis of the sensing result, and a function of turning on the transistor in response to the second signal and resetting the potential retained in the capacitor to an initialization state. It is possible to start refresh of the memory cell in response to the first signal.

In this specification and the like, ordinal numbers such as first, second, and third are used to avoid confusion among components, and the terms do not limit the components numerically or do not limit the order.

Note that in this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic appliance, and the like themselves might be semiconductor devices, or might each include a semiconductor device.

A transistor includes three nodes (terminals) called a gate, a source, and a drain. A gate is a node that controls the conduction state of a transistor. Depending on the conductivity type of the transistor or levels of potentials applied to the nodes (terminals), one of a pair of nodes (an input node and an output node) functions as a source and the other functions as a drain. In general, in an n-channel transistor, a node to which a low potential is applied is referred to as a source, and a node to which a high potential is applied is referred to as a drain. In contrast, in a p-channel transistor, a node to which a low potential is applied is referred to as a drain, and a node to which a high potential is applied is referred to as a source. In this specification, the two terminals other than the gate may be referred to as a first terminal and a second terminal.

In this specification and the like, to clarify a circuit configuration and circuit operation, one of two nodes (an input node and an output node) of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the drawings.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be deter mined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

One embodiment of the present invention can provide a novel semiconductor device and a method for driving the novel semiconductor device. One embodiment of the present invention can provide a semiconductor device with improved reliability and a method for driving the semiconductor device. One embodiment of the present invention can provide a memory device capable of reducing power consumption and a method for driving the memory device. One embodiment of the present invention can provide a memory device capable of optimizing a refresh cycle and a method for driving the memory device. One embodiment of the present invention can provide a memory device capable of performing temperature compensation and a method for driving the memory device.

Note that the description of these effects does not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF THE DRAWINGS

FIG. 11A is a top view; FIG. 11B is a cross-sectional view taken along a line y1-y2; FIG. 11C is a cross-sectional view taken along a line x1-x2; and FIG. 11D is a cross-sectional view taken along a line x3-x4.

FIG. 12A is a top view; FIG. 12B is a cross-sectional view taken along a line y1-y2; FIG. 12C is a cross-sectional view taken along a line x1-x2; and FIG. 12D is a cross-sectional view taken along a line x3-x4.

FIG. 13A is a top view; FIG. 13B is a cross-sectional view taken along a line y1-y2; FIG. 13C is a cross-sectional view taken along a line x1-x2; and FIG. 13D is a cross-sectional view taken along a line x3-x4.

FIG. 14A is a top view; FIG. 14B is a cross-sectional view taken along a line y1-y2; FIG. 14C is a cross-sectional view taken along a line x1-x2; and FIG. 14D is a cross-sectional view taken along a line x3-x4.

FIG. 15A is a top view; FIG. 15B is a cross-sectional view taken along a line y1-y2; FIG. 15C is a cross-sectional view taken along a line x1-x2; and FIG. 15D is a cross-sectional view taken along a line x3-x4.

FIG. 16A is a top view; FIG. 16B is a cross-sectional view taken along a line y1-y2; FIG. 16C is a cross-sectional view taken along a line x1-x2; and FIG. 16D is a cross-sectional view taken along a line x3-x4.

DETAILED DESCRIPTION OF THE INVENTION

Figure 1:
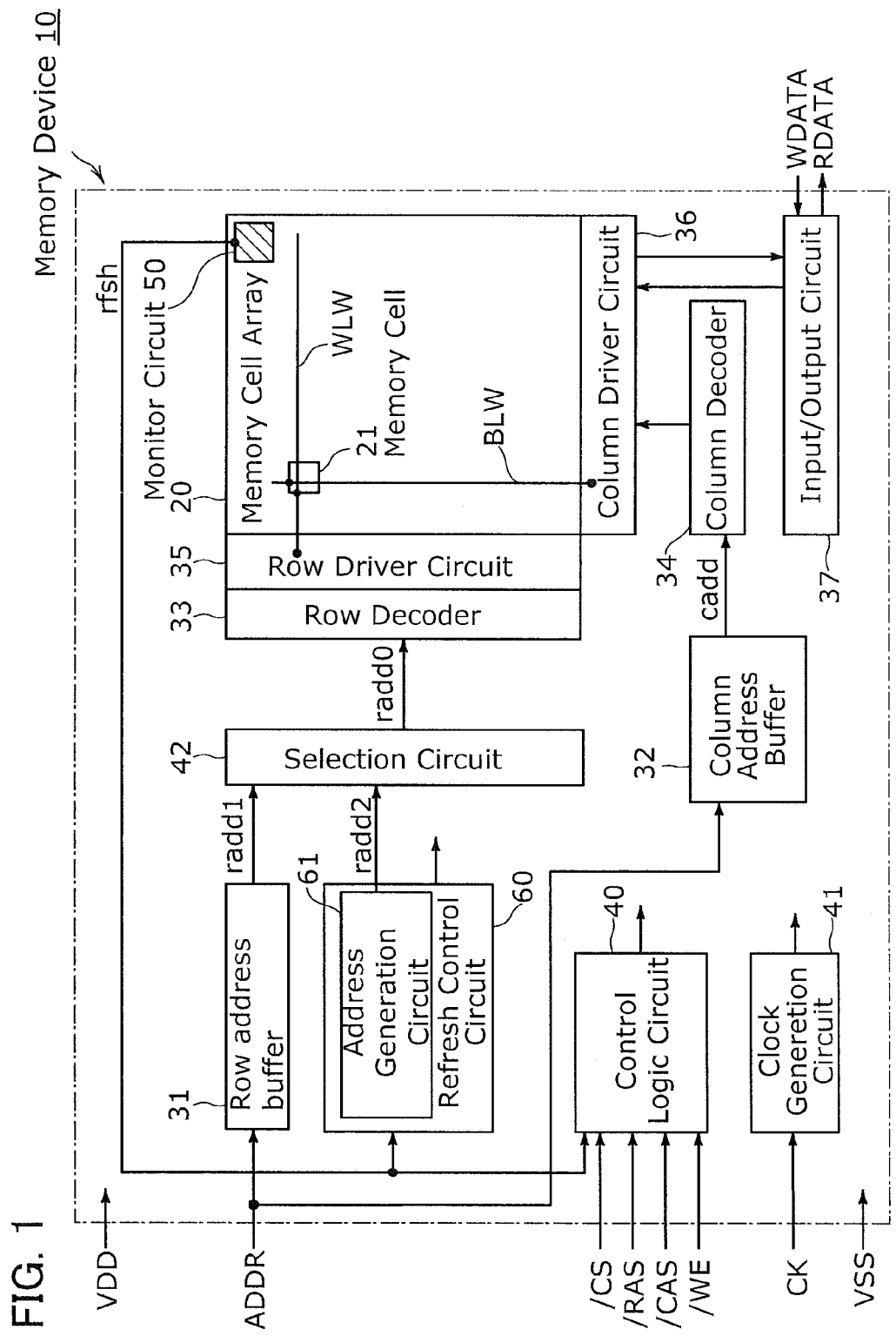
FIG. 1 is a block diagram illustrating a configuration example of a memory device.

Hereinafter, embodiments of the present invention will be described. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

In the drawings, the same components, components having similar functions, components formed of the same material, or components formed at the same time are denoted by the same reference numerals in some cases, and description thereof is not repeated in some cases. When the same reference numerals need to be distinguished from each other, "_1", "_2", "[n]", "[m, n]", or the like may be added to the reference numerals. For example, in the case where a plurality of wirings WLW in a memory cell array are individually distinguished from each other, the wiring WLW in the second row may be described as a wiring WLW[2] using an address number (row number) of the memory cell array.

In this specification, the clock signal CK is abbreviated to "a signal CK", "CK", or the like in some cases. The same applies to other components (e.g., signal, voltage, potential, circuit, element, electrode, and wiring).

Embodiments of the present invention are described below, and any of the embodiments can be combined as appropriate. In addition, in the case where some structure examples are given in one embodiment, any of the structure examples can be combined as appropriate.

Embodiment 1

In this embodiment, a memory device is described as an example of a semiconductor device.

□□ Configuration Example of Memory Device□□

FIG. 1 is a block diagram illustrating a configuration example of a memory device. A memory device 10 in FIG. 1 can be used as a dynamic random access memory (DRAM).

The memory device 10 includes a memory cell array 20, a row address buffer 31, a column address buffer 32, a row decoder 33, a column decoder 34, a row driver circuit 35, a column driver circuit 36, an input/output circuit 37, a control logic circuit 40, a clock generation circuit 41, a selection circuit 42, a monitor circuit 50, and a refresh control circuit 60.

Signals are input to the memory device 10 from the outside. Examples of the signals input from the outside are a clock signal CK, command signals (/CS, /RAS, /CAS, and /WE), an address signal ADDR, and a data signal WDATA. The data signal WDATA is a write data signal. The command signal /CS is a chip select signal. The command signal /RAS is a row address strobe signal. The command signal /CAS is a column address strobe signal. The command signal /WE is a write enable signal. To drive the memory device 10, a high power supply potential VDD and a low power supply potential VSS are input from the outside. For example, the potential VSS can be a ground potential or 0 V.

The control logic circuit 40 has a function of controlling the whole memory device 10. The control logic circuit 40 has a function of decoding the command signals (/CS, /RAS, /CAS, and /WE) input from the outside. The command signals processed by the control logic circuit 40 are not limited to these signals, and another command signal can be input depending on the circuit configuration and operations of the memory device 10. Furthermore, when one or more of the command signals are unnecessary, these signals are not necessarily input. The control logic circuit 40 generates control signals for circuits included in the memory device 10 on the basis of decoded command data, command data stored in the control logic circuit 40, or the like, and outputs them to the respective circuits.

The clock generation circuit 41 has a function of generating, from an external clock signal CK, an internal clock signal to be used in the memory device 10. Furthermore, the clock generation circuit 41 has a function of controlling supply of the internal clock signal.

The refresh control circuit 60 has at least a function of generating a row address signal radd2. The row address signal radd2 is generated in an address generation circuit 61 included in the refresh control circuit 60. The row address signal radd2 has a function of specifying a row in which a refresh operation is to be carried out. The refresh control circuit 60 may further have a function of controlling refresh operations of the memory cell array 20. The refresh control circuit 60 generates a control signal for executing a refresh operation and the row address signal radd2 on the basis of a signal rfsh from the monitor circuit 50, the control signal from the control logic circuit 40, the command signal input from the outside, and the like. Furthermore, the control logic circuit 40 may generate all or some of the control signals for executing refresh operations.

The input/output circuit 37 has a function of controlling input/output of the data signal WDATA and a data signal RDATA to/from the memory device 10, a function of controlling writing of the data signal WDATA to the memory cell array 20, a function of controlling reading of data from the memory cell array 20, a function of generating the data signal RDATA from data read from the memory cell array 20 and outputting the data signal RDATA, and the like. The data signal RDATA is a digital signal.

The address signal ADDR is input to the row address buffer 31 and the column address buffer 32. The row address buffer 31 has a function of retaining a row address signal. The selection circuit 42 has a function of selecting one of a row address signal radd1 output from the row address buffer 31 and the row address signal radd2 output from the refresh control circuit 60 and outputting the selected signal.

The row decoder 33 has a function of decoding a row address signal radd0 input from the selection circuit 42. The row driver circuit 35 has a function of generating a signal which is to be output to a wiring WLW. The wiring WLW in a row specified by the row address signal radd0 is selected by the row driver circuit 35.

The column decoder 34 has a function of decoding a column address signal cadd output from the column address buffer 32. The column driver circuit 36 includes a reading circuit and a writing circuit. The reading circuit has a function of reading data from the memory cells 21 in a column specified by the column address signal cadd. The reading circuit includes a sense amplifier (also referred to as a main amplifier) and has a function of detecting and amplifying a potential difference between a pair of wirings BLW. Specifically, the sense amplifier has a function of amplifying a potential difference between a reference voltage (e.g., VDD/2) and the wiring BLW. The potential amplified by the sense amplifier is output to the input/output circuit 37. The writing circuit has a function of outputting a data signal to the wiring BLW in a column specified by the column address signal cadd. The writing circuit may include a precharge circuit having a function of precharging the wiring BLW.

<Memory Cell, Memory Cell Array>

Figure 2A:
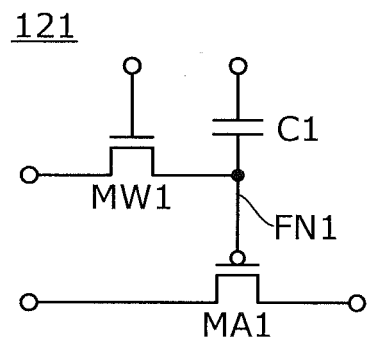
FIGS. 2A to 2D are circuit diagrams each illustrating a configuration example of a memory cell.
Figure 2B:
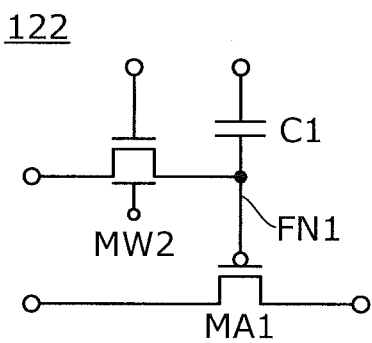
Figure 2C:
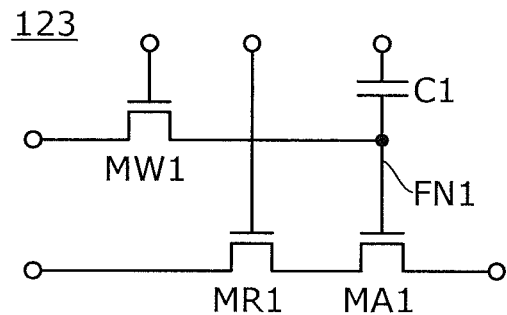
Figure 2D:
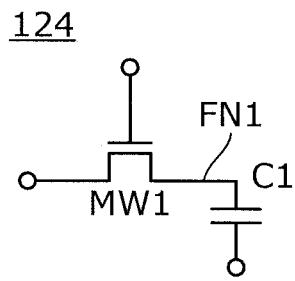
Figure 3A:
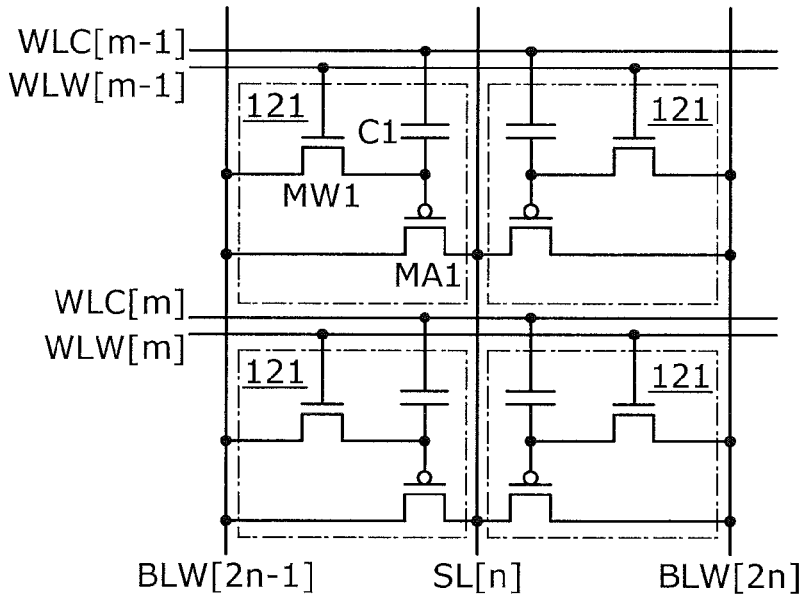
FIGS. 3A and 3B are circuit diagrams each illustrating a configuration example of a memory cell array.
Figure 3B:
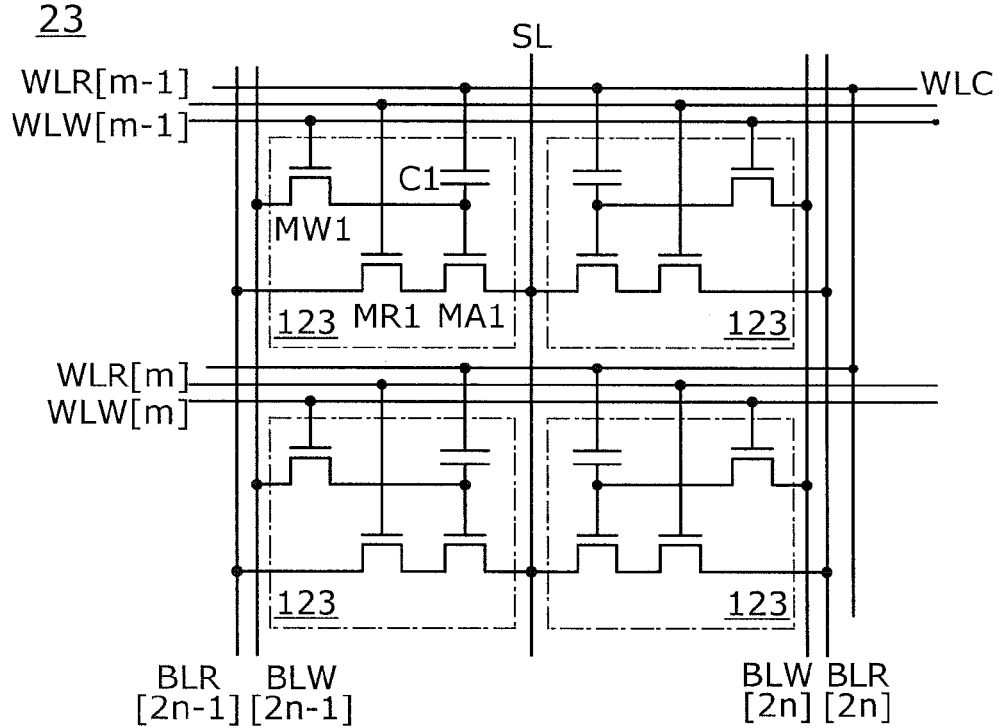

FIGS. 2A to 2D are circuit diagrams each illustrating a configuration example of a memory cell, and FIGS. 3A and 3B are circuit diagrams each illustrating a configuration example of a memory cell array. Note that the conductivity types of transistors in FIGS. 2A to 2D can be changed as appropriate. For example, although a transistor MA1 in FIG. 2A is a p-channel transistor, it can be an n-channel transistor. The memory cell 21 may be a binary memory cell capable of retaining 1-bit data, or may be a multilevel memory cell capable of retaining data of 2 or more bits.

A memory cell 121 in FIG. 2A includes a node FN1, a transistor MW1, the transistor MA1, and a capacitor C1. The memory cell 121 is a gain cell which includes two transistors. The node FN1 functions as a potential retention portion that retains a potential corresponding to data. The transistor MW1 can function as a writing transistor. The transistor MW1 is turned on, so that a data signal is written to the node FN1. The transistor MA1 can function as a reading transistor. Furthermore, the transistor MA1 can function as an amplifying transistor that amplifies the potential retained in the node FN1.

The capacitor C1 can function as a storage capacitor of the node FN1. Note that load capacitance of the node FN1 corresponds to combined capacitance of the capacitor C1, which is intentionally provided, and parasitic capacitance of the node FN1 (e.g., gate capacitance of the transistor MA1). The load capacitance can function as storage capacitance of the node FN1. Therefore, in some cases, it is possible to retain the potential of the node FN1 without providing the capacitor C1, depending on the device configuration and the like of the memory cell 121.

FIG. 3A illustrates an example of a memory cell array formed with such memory cells 121. The memory cells 121 are arranged in two rows and two columns in FIG. 3A. Symbols such as [m] and [2n−1] which are given to the reference numerals in FIG. 3A indicate a row address or a column address. Here, m is an integer greater than or equal to 2 and n is an integer greater than or equal to 1.

In a memory cell array 22 in FIG. 3A, the wiring WLW and a wiring WLC are provided in each row, and the wiring BLW is provided in each column. A wiring SL is shared by two adjacent columns. The potential of the wiring WLC may be controlled by the row driver circuit 35. The potential of the wiring SL may be controlled by the column driver circuit 36. In the case where a constant potential (e.g., VDD or VSS) is supplied to the wiring SL, the wiring SL may function as a potential supply line.

The wiring WLC and the node FN1 are capacitively coupled to each other via the capacitor C1; therefore, the potential of the node FN1 can be changed in accordance with the potential of the wiring WLC. That is, the capacitor C1 can function as a capacitive capacitor, and the wiring WLC can function as a signal supply line (potential supply line) for supplying a signal (potential) to a terminal of the capacitor C1.

A memory cell 122 in FIG. 2B is a modification example of the memory cell 121. A transistor MW2 having a back gate electrode is provided instead of the transistor MW1.

A memory cell 123 in FIG. 2C includes the node FN1, the transistor MW1, the transistor MA1, a transistor MR1, and the capacitor C1. The memory cell 123 is a gain cell including three transistors (3T gain cell). The transistor MR1 can function as a reading transistor.

FIG. 3B illustrates an example of a memory cell array formed with such memory cells 123. In a memory cell array 23 in FIG. 3B, the wiring WLW and a wiring WLR are provided in each row, and the wiring BLW and a wiring BLR are provided in each column. In the example of FIG. 3B, the wiring SL functions as a potential supply line for supplying a constant potential (e.g., VSS or VDD) and is shared by the memory cell array 23. The wiring WLC functions as a potential supply line for supplying a constant potential (e.g., VSS or VDD) to a terminal of the capacitor C1 and is shared by the memory cell array 23. In the case where the potential of a first terminal of the transistor MA1 is changed by the driving method of the memory cell 123, for example, the wiring SL may be provided in each column or provided in every two columns as in FIG. 3A; in the case where the potential of a terminal of the capacitor C1 is changed, for example, the wiring WLC may be provided in each row as in FIG. 3A.

Note that the wiring BLR may be provided as in the memory cell array 23, and the transistor MW1 and the wiring BLR may be electrically connected to each other in the memory cell array 22.

A memory cell 124 in FIG. 2D which includes the node FN1, the transistor MW1, and the capacitor C1 can be used as the memory cell 21.

<Transistors in Memory Cell>

To reduce the frequency of refresh in the memory cell 21, it is preferable that a drain current in an off-state (off-state current) of a writing transistor (specifically, the transistor MW1 and the transistor MW2) be as small as possible. To minimize the off-state current of a transistor, for example, the channel may be formed using a semiconductor having a band gap of greater than or equal to 2.5 eV and a carrier concentration of less than or equal to $1 \times 10^{14}$ cm$^{-3}$. A semiconductor layer having such characteristics is, for example, an oxide semiconductor layer. It is extremely effective to use an OS transistor as the transistor MW1 in order to reduce the frequency of refresh of the memory cell 21. In the OS transistor, a normalized off-state current per micrometer of a channel width at a source-drain voltage of 10 V can be less than or equal to $10 \times 10^{-21}$ A (10 zA (zeptoampere)).

In an OS transistor used in the memory device 10, an oxide semiconductor (OS) layer including a channel formation region may be formed of a single oxide semiconductor film or two or more oxide semiconductor films. The oxide semiconductor film included in the OS layer is preferably formed with an oxide semiconductor containing at least one element selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. In addition, the oxide may contain an element other than In, Ga, Sn, and Zn, for example, an oxide semiconductor containing SiO$_2$.

There is no particular limitation on the transistor MA1 and the transistor MR1. In the case where the transistor MA1 and the transistor MR1 are n-channel transistors, they can be OS transistors like the transistor MW1. For example, the channels of the transistors MA1 and MR1 can be formed using a semiconductor of a Group 14 element (e.g., Si, C, or Ge). A typical example of such a transistor is a silicon transistor. A transistor formed using a semiconductor substrate (bulk or SOI) can be used as each of the transistor MR1 and the transistor MA1 For example, the transistor MA1 can be a Si transistor formed over a bulk-type single crystal silicon substrate or a Si transistor formed over an SOI-type single crystal silicon substrate. Note that a Si transistor is a transistor whose a channel is formed of silicon.

A semiconductor substrate for manufacturing the memory device 10 is not limited to a single crystal silicon substrate, and the semiconductor substrate can be, for example, a single-material semiconductor substrate of silicon, germanium, or the like or a compound semiconductor substrate of silicon carbide, silicon germanium, gallium arsenide, gallium nitride, indium phosphide, zinc oxide, gallium oxide, or the like. The crystallinity of the semiconductor substrate is preferably single crystal but not limited thereto and may be amorphous, polycrystalline, or microcrystalline.

In the case where the memory device 10 is manufactured using the semiconductor substrate, an OS transistor can be provided to be stacked over an element region of the semiconductor substrate. When the memory device 10 has such a device structure, a combined memory in which the memory device 10 and a logic circuit (e.g., a CPU core) are incorporated in the same IC chip can be obtained. This enables a reduction in the size of the memory cell 21; therefore, an increase in the capacity of the memory cell array 20 can be facilitated. Note that the device structure of the memory device 10 is described in Embodiment 3.

<<Monitor Circuit>>

Figure 4:
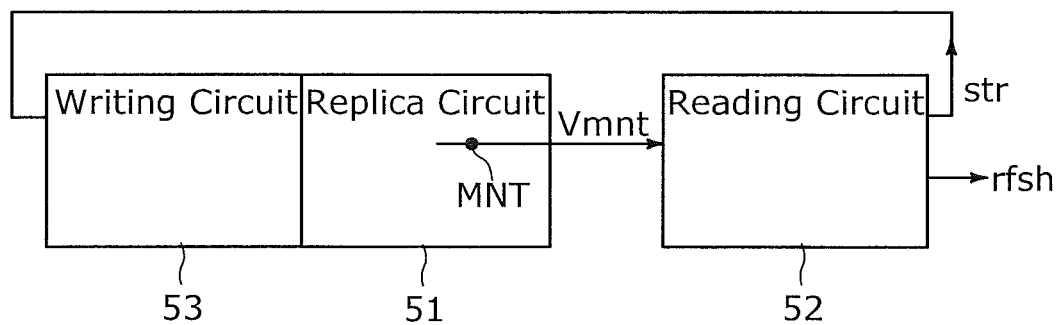
FIG. 4 is a block diagram illustrating a configuration example of a monitor circuit.

The monitor circuit 50 has a function of generating the signal rfsh for requesting a refresh operation. Specifically, the signal rfsh has a function of permitting execution of refresh and can function as a trigger signal for a self refresh operation. FIG. 4 illustrates a configuration example of the monitor circuit 50. The monitor circuit 50 in FIG. 4 includes a replica circuit 51, a reading circuit 52, and a writing circuit 53.

It is difficult to directly detect a potential retained in the memory cell 21; therefore, the replica circuit 51 is provided as an alternative reference memory cell a potential of which is detected. The replica circuit 51 includes a node MNT which retains a potential. The reading circuit 52 has a function of reading a potential Vmnt of the node MNT in the replica circuit 51 and generating the signal rfsh and a signal str on the basis of the potential Vmnt. The writing circuit 53 has a function of writing data to the replica circuit 51 in response to the signal str. That is, the monitor circuit 50 has a function of writing a potential to the replica circuit 51, a function of monitoring the potential retained in the replica circuit 51, and a function of generating the signal rfsh and the signal str on the basis of the monitoring result.

Refresh begins in response to the signal rfsh generated in the monitor circuit 50, whereby the refresh cycle of the memory device 10 can be dynamically changed. Optimization of the refresh cycle is effective in reducing power consumption. The electrical characteristics of the transistors provided in the memory cell 21 change depending on temperature; therefore, the retention characteristics of the memory cell 21 also change depending on the temperature. The retention characteristics of the replica circuit 51 also change depending on the temperature in a manner similar to those of the memory cell 21; thus, temperature compensation of the refresh cycle is possible. To optimize the refresh cycle, the replica circuit 51 is preferably provided physically close to the memory cell array 20.

Thus, refresh can be performed with appropriate timing owing to the monitor circuit 50; as a result, the power consumption can be reduced. The monitor circuit 50 enables self refresh to be executed in the memory device 10 with appropriate timing even without a timer function. Furthermore, even without a temperature detecting function, temperature compensation of the refresh cycle is possible. In addition, data can be securely retained in each memory cell 21 for a long period, which leads to high reliability of the memory device 10. In the case where the memory cell 21 is a multilevel memory cell, which can store multilevel data, the amount of allowable change in retention potential is smaller than that of a binary memory cell, and thus the refresh cycle is short. The monitor circuit 50 makes it possible to inhibit an increase in power consumption and securely retain data for a long period even in a multilevel memory cell.

Accordingly, a reduction in the power consumption of an electronic component or an electronic appliance provided with the memory device 10, an improvement in the reliability thereof, stable operation with few malfunctions thereof, and the like can be achieved.

Configuration Example 1 of Monitor Circuit

Figure 5A:
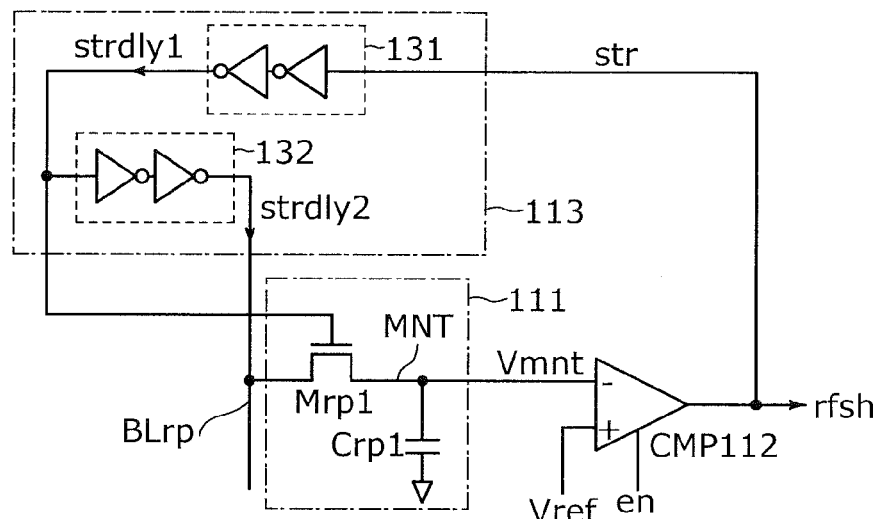
FIG. 5A to 5C are circuit diagrams illustrating configuration examples of a monitor circuit, a comparator, and a writing circuit, respectively.
Figure 5B:
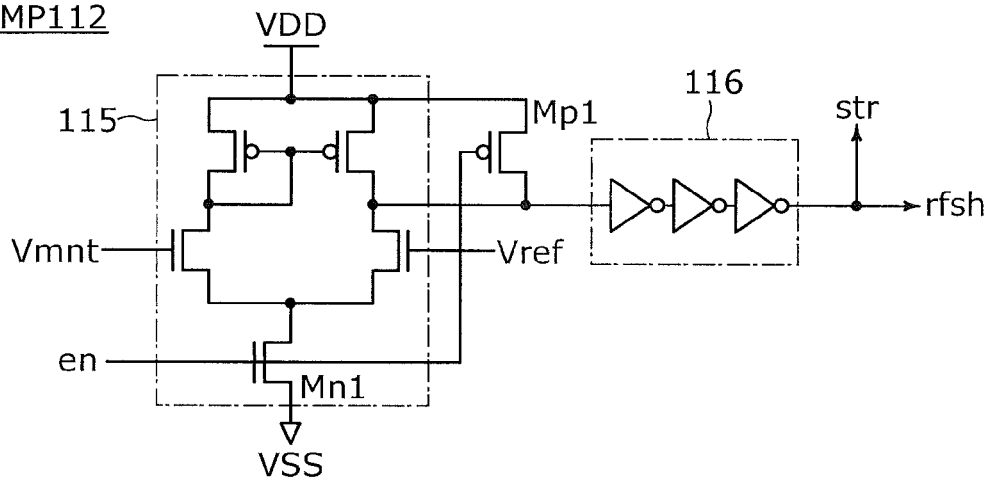

FIG. 5A illustrates an example of the circuit configuration of a monitor circuit. A monitor circuit 101 in FIG. 5A includes a replica circuit 111, a comparator (CMP) 112, and a circuit 113. FIG. 5B illustrates an example of the circuit configuration of the CMP 112.

<Replica Circuit>

The replica circuit 111 includes the node MNT, a transistor Mrp1, and a capacitor Crp1. Like the transistor MW1, the transistor Mrp1 can function as a writing transistor. The capacitor Crp1 functions as a storage capacitor for retaining the potential Vmnt of the node MNT. A first terminal of the capacitor Crp1 is connected to the node MNT, and a second terminal thereof is supplied with a constant potential (e.g., VSS or a ground potential). A gate of the transistor Mrp1 of the replica circuit 111 is electrically connected to an output of the circuit 113, a first terminal thereof is connected to a wiring BLrp, and a second terminal thereof is electrically connected to the node MNT. The wiring BLrp can function as a bit line to which a potential that is to be written to the replica circuit 111 is input.

To optimize the refresh cycle, it is preferable that the transistor Mrp1 of the replica circuit 111 be formed in the same process as the writing transistor of the memory cell 21. Furthermore, it is preferable that the replica circuit 111 have lower retention characteristics than the memory cell 21. Thus, refresh can be more certainly executed before data is lost in the memory cell 21. The amount of leakage of charge from the data retention portion (MNT) of the replica circuit 111 is preferably larger than that of the memory cell 21. Specifically, at least one of the following and the like is employed: to increase the channel width of the transistor Mrp1; to reduce the capacitance of the capacitor Crp1; and to increase a reference potential Vref. For example, in the case where the specifications and electrical characteristics of the transistor Mrp1 and the capacitor Crp1 are made equal to those of the memory cell 21, the reference potential Vref of the CMP 112 is increased.

<Reading Circuit>

The CMP 112 is a circuit corresponding to the reading circuit 52 in FIG. 4 and has a function of determining whether or not a potential Vmnt of the node MNT is lower than the reference potential Vref. The CMP 112 has a function of comparing the reference potential Vref with the potential Vmnt and outputting the comparison result at either of two logic states, i.e., at a high level potential or a low level potential. In the example of FIG. 5A, an output signal of the CMP 112 is the signal rfsh, and the signal rfsh is also used as the signal str. A circuit capable of performing a logical operation of the signal rfsh and another control signal or the like may be separately provided so as to generate the signal str.

The CMP 112 in FIG. 5B includes an amplifier circuit 115, a circuit 116, and a transistor Mp1. A signal en is input to each gate of a transistor Mn1 and the transistor Mp1. The transistor Mn1 can function as a current source for the amplifier circuit 115. An output of the amplifier circuit 115 is a high level potential when Vmnt>Vref is satisfied, and is a low level potential when Vmnt<Vref is satisfied. The circuit 116 has a function of processing an output signal of the amplifier circuit 115 to change the signal into a signal rfsh having a high logic level ("H") or a low logic level ("L"). In the example of FIG. 5B, a buffer circuit is used as the circuit 116, and the circuit 116 includes an odd number of stages of inverter circuits. The logic level of the signal rfsh is "L" when the output of the amplifier circuit 115 is a high level potential, and is "H" when the output of the amplifier circuit 115 is a low level potential.

The signal en is used as an enable signal that activates the CMP 112. When the signal en is at "L", the amplifier circuit 115 does not function, and the output of the amplifier circuit 115 is constantly a high level potential owing to the transistor Mp1. Thus, in a period in which the signal en is at "L", the signal rfsh is constantly at "L", so that the refresh control circuit 60 does not operate.

For example, while the power supply potential VDD is supplied to the memory device 10, VDD may be input as the signal en. Alternatively, the signal en at "H" may be input to the CMP 112 at regular or irregular intervals. For example, the signal en at "H" may be input at intervals of $1\times10^{-3}$ times or more and 0.5 times or less a retention period of the memory device 10. The signal en at "H" may be input at the timing when the power supply of the memory device 10 is performed or stopped so that the potential Vmnt of the replica circuit 111 can be detected.

<Writing Circuit>

The circuit 113 corresponds to the writing circuit 53 in FIG. 4. In the example of FIG. 5A, the circuit 113 includes a circuit 131 and a circuit 132. The circuit 131 and the circuit 132 each include an even number of stages of inverter circuits and can function as a delay circuit. Note that in the case where the transistor Mrp1 is a p-channel transistor, an odd number of stages of inverter circuits may be provided in the circuit 131. The circuit 131 has a function of delaying the signal str to generate a delay signal strdly1. The circuit 132 has a function of delaying the signal strdly1 to generate a delay signal strdly2. The potential of the signal strdly1 can be set to a high level owing to a high power supply potential of the inverter circuit of the last stage of the circuit 131, and the potential of the signal strdly1 can be set to a high level owing to a high power supply potential of the inverter circuit of the last stage of the circuit 132.

The signal strdly1 is input to the gate of the transistor Mrp1, and the signal strdly2 is input to the wiring BLrp. When the signal rfsh is set at "H", the signal strdly1 and the signal strdly2 each having a high level potential are generated in the circuit 113 and output to the replica circuit 111. Thus, after the gate of the transistor Mrp1 becomes at a high level potential, a potential to be written to the node MNT is input to the first terminal of the transistor Mrp1. Therefore, in the monitor circuit 101, the node MNT of the replica circuit 111 can be reset to the initial state in advance of refresh of the memory cell array 20. For example, the high power supply potential of the inverter circuit of the last stage of the circuit 132 is VDD, the potential of the node MNT in the initial state of the replica circuit 111 is VDD.

(Another Configuration Example)

Figure 5C:
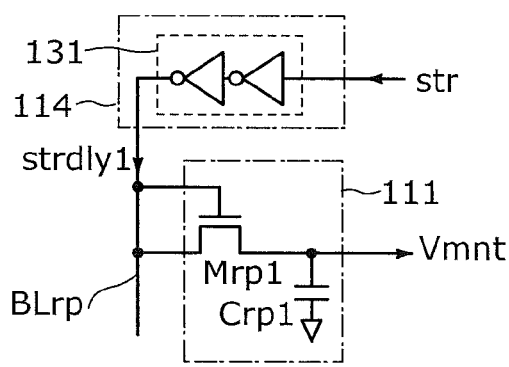

Instead of the circuit 113, a circuit 114 (see FIG. 5C) not including the circuit 132 can be used as the writing circuit 53. In this case, the signal strdly1 is input to the gate of the transistor Mrp1 and the wiring BLrp. The circuit 113 including the circuit 132 is preferable as the writing circuit 53. The reasons are as follows, for example: the wiring BLrp can be set to a high level potential after transition of the transistor Mrp1 of the replica circuit 111 from a non-conduction state to a conduction state begins; and the high level potential of the gate of the transistor MW1 can be made different from the high level potential of the wiring BLrp.

The use of the monitor circuit 101 makes it possible to perform rewriting of the replica circuit 111 independently of the self refresh of the memory device 10. The replica circuit 111 can be brought into the initial state at the timing when self refresh begins; therefore, the state of the replica circuit 111 can be regarded as equivalent to that of the memory cell 21 on which rewriting has been performed lastly of the memory cell array 20. Thus, the potential Vmnt of the replica circuit 111 is monitored, and then the signal rfsh is generated on the basis of the monitoring result, whereby execution of excessive refresh can be avoided while the reliability of the memory cell array 20 is ensured; as a result, the power consumption of the memory device 10 can be reduced, and the processing efficiency can be improved.

Configuration Example 2 of Monitor Circuit

Figure 6:
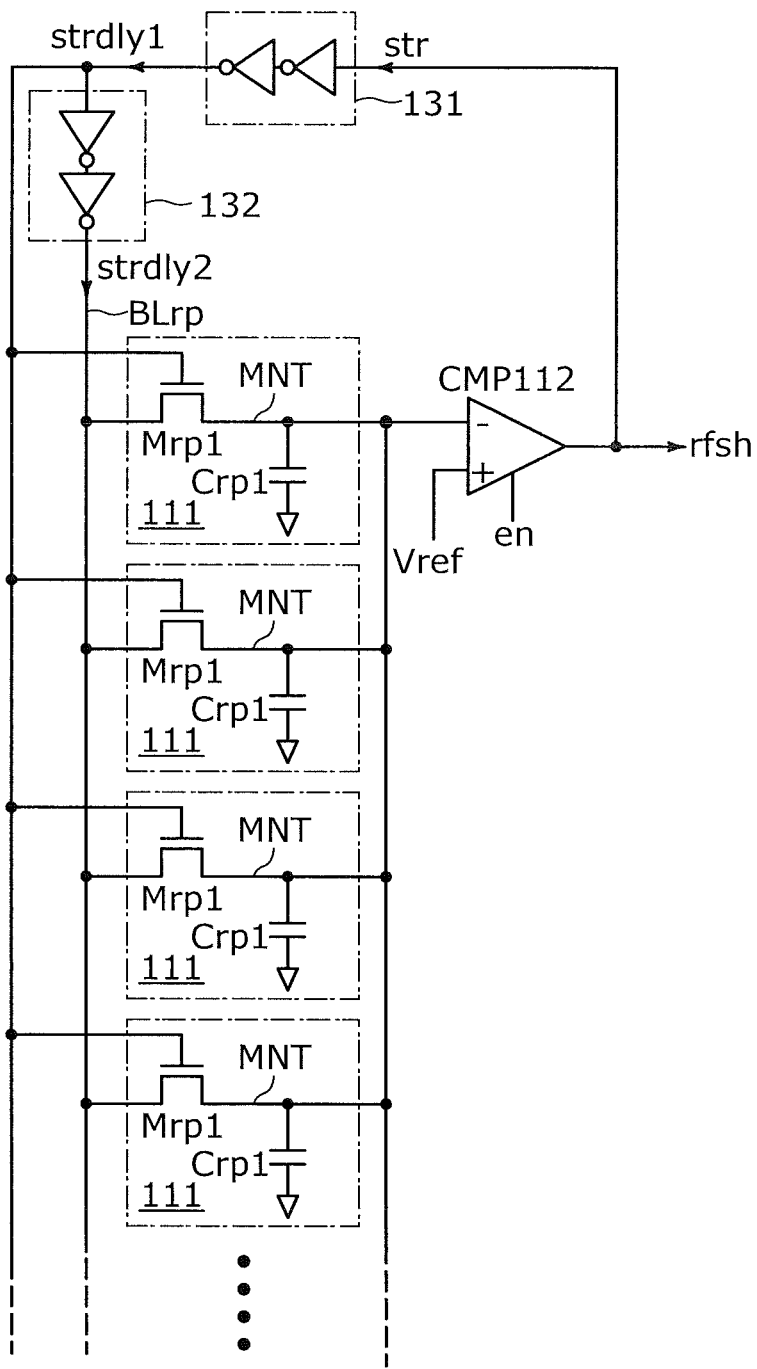
FIG. 6 is a circuit diagram illustrating a configuration example of a monitor circuit.

FIG. 6 illustrates another configuration example of the monitor circuit. A monitor circuit 102 in FIG. 6 includes a plurality of rows of replica circuits 111. With such a structure, the potentials of the nodes MNT can be averaged. The circuit 132 is not necessarily provided in the monitor circuit 102.

Another Configuration Example of Memory Device

In the memory device 10 in FIG. 1, self refresh of all the memory cells 21 in the memory cell array 20 is executed in response to the signal rfsh output from the monitor circuit 50. It is possible to execute refresh of part of the memory cell array 20. For example, refresh may be performed on a bank-by-bank basis, a mat-by-mat basis, or a row-by-row basis.

Configuration Example 2

Figure 7:
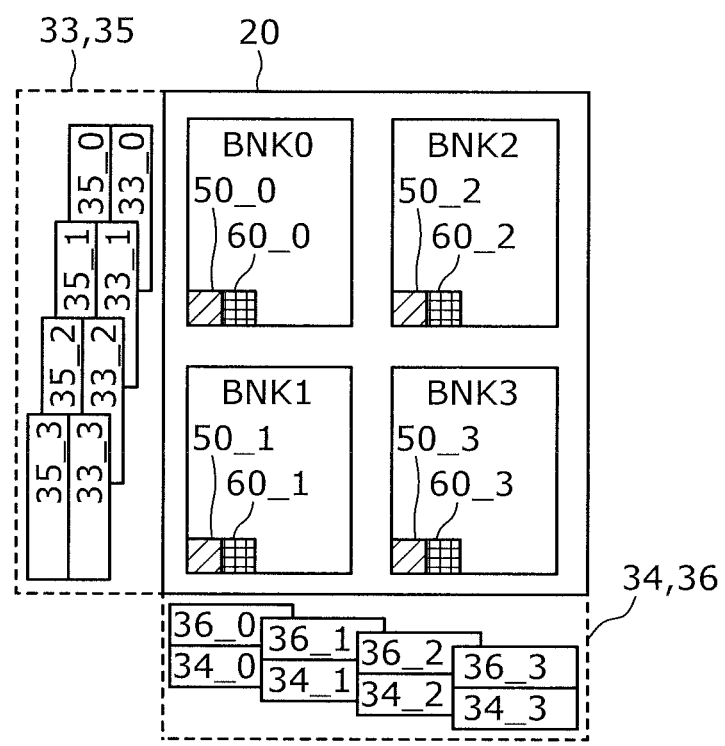
FIG. 7 is a block diagram illustrating a configuration example of a memory cell array.

The memory cell array in FIG. 1 may have a multibank structure with a plurality of banks. In the example of FIG. 1, self refresh of all the banks is executed in response to the signal rfsh. In the case where the memory cell array 20 has a multibank structure, the monitor circuit 50 and the refresh control circuit 60 can be provided in each bank, so that self refresh of each bank can be performed independently. Such an example is illustrated in FIG. 7. In the example of FIG. 7, the memory cell array 20 is divided into four banks (BNK0, BNK1, BNK2, and BNK3). The banks BNK0 to BNK3 are provided with monitor circuits (50_0, 50_1, 50_2, and 50_3) and refresh control circuits (60_0, 60_1, 60_2, and 60_3), respectively. Writing and reading operations of the banks BNK0 to BNK3 can be independently performed. Therefore, the banks BNK0 to BNK3 are each provided with the row decoder 33, the column decoder 34, the row driver circuit 35, and the column driver circuit 36. A reference numeral such as "_0" is written in each circuit in FIG. 7 to indicate that the circuit is provided in each bank.

For example, when the signal rfsh is generated in the monitor circuit 50_1, a row address signal and a control signal for refreshing the bank BNK1 are generated in the refresh control circuit 60_1 and output to a peripheral circuit corresponding to BNK1. In the banks except the bank BNK1, a refresh operation is not executed and an operation can be performed by normal access request.

Figure 8:
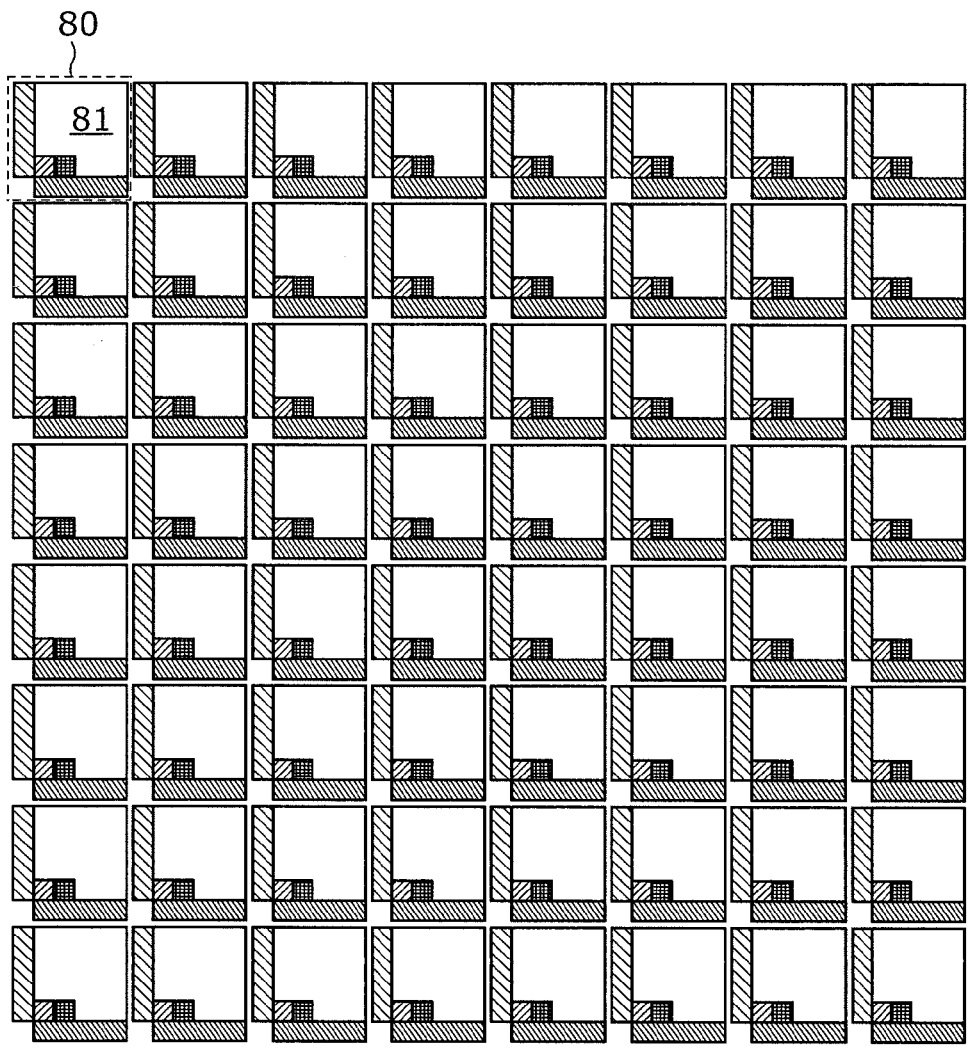
FIG. 8 is a block diagram illustrating a structure example of a bank.

Each of the banks BNK0 to BNK3 can be divided into blocks each of which can independently execute reading and writing operations. The block may be referred to as a mat. FIG. 8 illustrates an example in which the bank BNK0 is divided into blocks in eight rows and eight columns. Each of the BNK1 to BNK3 also has a similar configuration. FIG. 8 illustrates the bank BNK0 and some peripheral circuits. A mat 80 includes a sub-row driver circuit 75 and a sense amplifier portion 76 in addition to a memory cell array 81 included in the bank BNK0. The sub-row driver circuit 75 is included in a row driver circuit 35_0, and the sense amplifier portion 76 is included in a column driver circuit 36_0. The monitor circuit 50 and the refresh control circuit 60 are provided in each mat 80. Such a configuration allows each mat 80 to be refreshed independently. Furthermore, the configuration enables optimization of the refresh cycle of each mat 80. Thus, refresh can be performed efficiently in the memory device 10.

Figure 9:
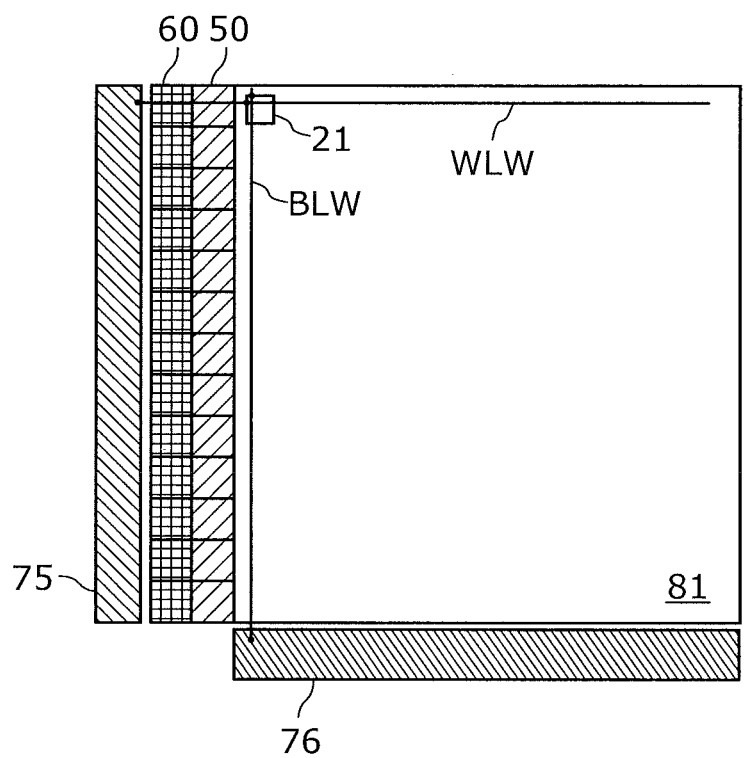
FIG. 9 is a block diagram illustrating a configuration example of a mat.
Figure 10:
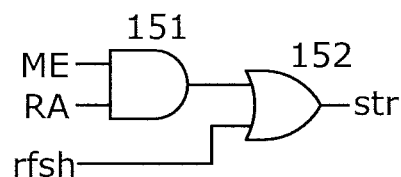
FIG. 10 is a circuit diagram illustrating a configuration example of a circuit having a function of generating a signal str.

The monitor circuit 50 and the refresh control circuit 60 may be provided in each row of the mats 80 (in each wiring WLW). FIG. 9 illustrates such a configuration example. In this case, a circuit generating the signal str may be provided in the monitor circuit 50. FIG. 10 illustrates an example of a circuit that generates the signal str. A circuit 150 in FIG. 10 includes an AND circuit 151 and an OR circuit 152. A signal ME and a signal RA are input to the AND circuit 151. The signals ME and RA are each a command signal which is generated in the memory device 10. The signal ME is a mat enable signal, and the signal RA is a refresh address signal. For example, the signal ME is generated by the row decoder 33 of the bank including the mats 80. The signal RA is generated in the row decoder of the mat 80.

Regardless of the logic levels of the signals ME and RA, in the circuit 150, the logic level of the signal str is set at "H" when the signal rfsh is set at "H", the replica circuit 51 of the monitor circuit 50 in the corresponding row is initialized, and the memory cells 21 in the row are refreshed. Furthermore, regardless of the logic level of the signal rfsh, when the signals ME and RA are set at "H", the logic level of the signal str is "H". That is, even in the case where writing or refresh in reading is executed in response to request of the signals ME and RA, the replica circuit 51 in the corresponding row can be reset. Thus, refresh can be executed in each row in an appropriate cycle. As a result, an improvement in the reliability and a reduction in the power consumption of the memory device 10 can be achieved.

Embodiment 2

In this embodiment, an OS transistor is described.
<<Structure Example 1 of OS Transistor>>

Figure 11A:
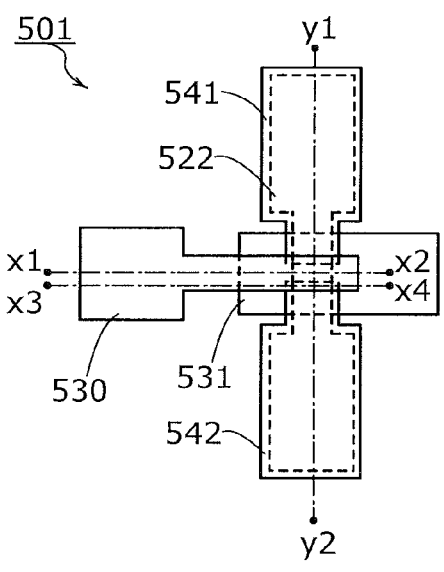
FIGS. 11A to 11D illustrate a structure example of an OS transistor.
Figure 11B:
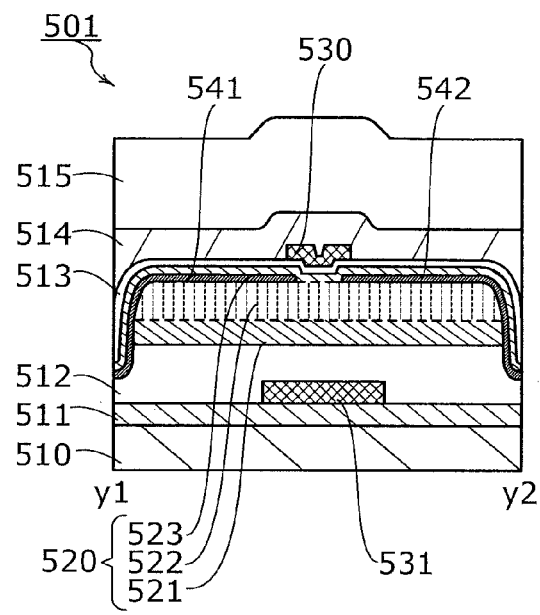
Figure 11C:
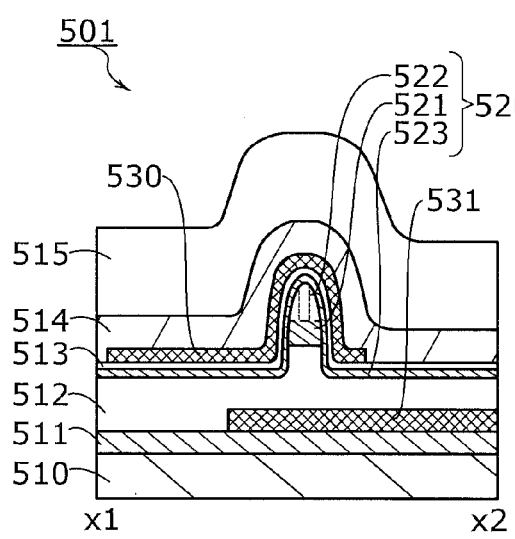
Figure 11D:
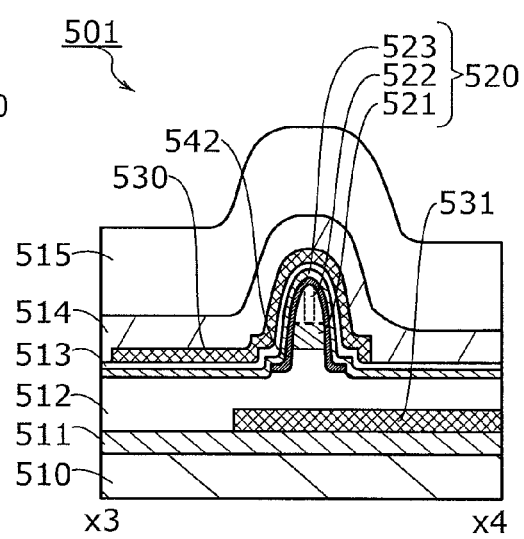

FIGS. 11A to 11D illustrate an example of a structure of an OS transistor. FIG. 11A is a plan view illustrating a structure example of an OS transistor. FIG. 11B is a cross-sectional view taken along a line y1-y2, FIG. 11C is a cross-sectional view taken along a line x1-x2, and FIG. 11D is a cross-sectional view taken along a line x3-x4. Here, in some cases, the direction of the line y1-y2 is referred to as a channel length direction, and the direction of the line x1-x2 is referred to as a channel width direction. Accordingly, FIG. 11B illustrates a cross-sectional structure of the OS transistor in the channel length direction, and FIGS. 11C and 11D each illustrate a cross-sectional structure of the OS transistor in the channel width direction.

An OS transistor 501 illustrated in FIGS. 11A to 11D includes a back gate. The OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor 501 includes an insulating layer 512, an insulating layer 513, oxide semiconductor (OS) layers 521 to 523, a conductive layer 530, a conductive layer 531, a conductive layer 541, and a conductive layer 542. Here, the OS layers 521, 522, and 523 are collectively referred to as an OS layer 520.

The insulating layer 513 includes a region functioning as a gate insulating layer. The conductive layer 530 functions as a gate electrode. The conductive layer 531 functions as a back gate electrode. A constant potential, the same potential or signal supplied to the conductive layer 530, or a potential or signal that is different from that supplied to the conductive layer 530 may be supplied to the conductive layer 531. The conductive layer 541 and the conductive layer 542 function as a source electrode and a drain electrode.

As illustrated in FIGS. 11B and 11C, the OS layer 520 includes a region where the OS layer 521, the OS layer 522, and the OS layer 523 are stacked in this order. The insulating layer 513 covers this stacked region. The conductive layer 530 overlaps the stacked region with the insulating layer 513 positioned therebetween. The conductive layer 541 and the conductive layer 542 are provided over the stacked film formed of the OS layer 521 and the OS layer 522 and are in contact with a top surface of this stacked film and a side surface positioned in the channel length direction of the stacked film. In the example of FIGS. 11A to 11D, the conductive layers 541 and 542 are also in contact with the insulating layer 512. The OS layer 523 is formed to cover the OS layers 521 and 522 and the conductive layers 541 and 542. A bottom surface of the OS layer 523 is in contact with a top surface of the OS layer 522.

The conductive layer 530 is formed so as to surround, in the channel width direction, the region where the OS layers 521 to 523 are stacked in the OS layer 520 with the insulating layer 513 positioned therebetween (see FIG. 11C). Therefore, a gate electric field in the vertical direction and a gate electric field in the lateral direction are applied to this stacked region. In the OS transistor 501, "the gate electric field" refers to an electric field generated by a voltage applied to the conductive layer 531 (gate electrode layer). Accordingly, the whole stacked region of the OS layers 521 to 523 can be electrically surrounded by the gate electric fields, so that a channel is formed in the whole OS layer 522 (bulk), in some cases. Thus, high on-state current characteristics of the OS transistor 501 can be achieved.

In this specification, a structure of a transistor in which a semiconductor is electrically surrounded by a gate electric field as in the above transistor is referred to as "a surrounded channel (s-channel) structure". The OS transistor 501 has the s-channel structure. With this s-channel structure, a large amount of current can flow between the source and the drain of the transistor, so that a high drain current in an on state (high on-state current) can be achieved.

By employing the s-channel structure in the OS transistor 501, channel formation region controllability by a gate electric field applied to the side surface of the OS layer 522 becomes easy. In the structure where the conductive layer 530 reaches below the OS layer 522 and faces the side surface of the OS layer 521, higher controllability can be achieved, which is preferable. Consequently, the subthreshold swing (S value) of the OS transistor 501 can be made small, so that a short-channel effect can be reduced. Thus, the s-channel structure is appropriate for miniaturization.

When an OS transistor which has a three-dimensional structure as in the OS transistor 501 illustrated in FIGS. 11A to 11D, the channel length can be less than 100 nm. By the miniaturization, the circuit area of the OS transistor can be made small. The channel length of the OS transistor is preferably less than 65 nm, further preferably less than or equal to 30 nm or less than or equal to 20 nm.

A conductor functioning as a gate of a transistor, a conductor functioning as a source of a transistor, and a conductor functioning as a drain of a transistor are referred to as a gate electrode, a source electrode, and a drain electrode, respectively. A region functioning as a source of a transistor and a region functioning as a drain of a transistor are referred to as a source region and a drain region, respectively. In this specification, a gate electrode might be referred to as a gate, a drain electrode or a drain region might be referred to as a drain, and a source electrode or a source region might be referred to as a source.

The channel length refers to, for example, a distance between a source and a drain in a region where a semiconductor (or a portion where a current flows in a semiconductor when a transistor is on) and a gate overlap each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate overlap with each other, or a region where a channel is formed. In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the plan view.

In this specification, in the case where the term "channel width" is simply used, it may denote an apparent channel width in some cases. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

<<Structure Example 2 of OS Transistor>>

Figure 12A:
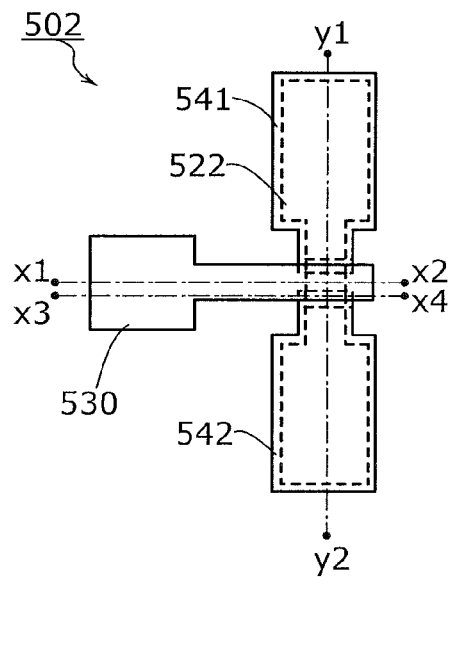
FIGS. 12A to 12D illustrate a structure example of an OS transistor.
Figure 12B:
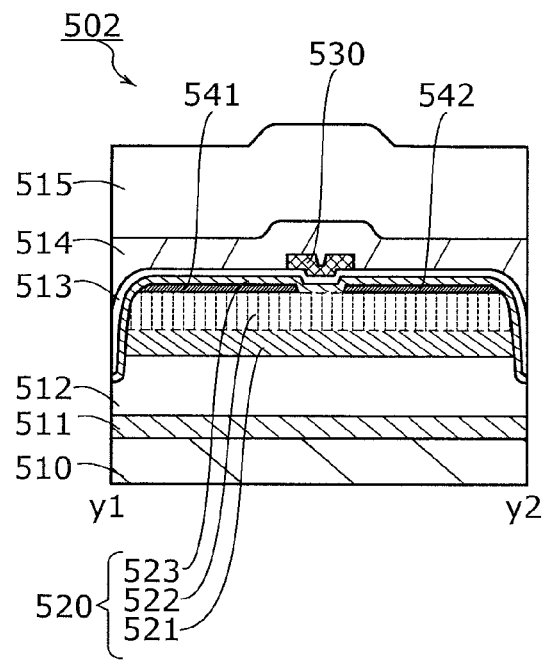
Figure 12C:
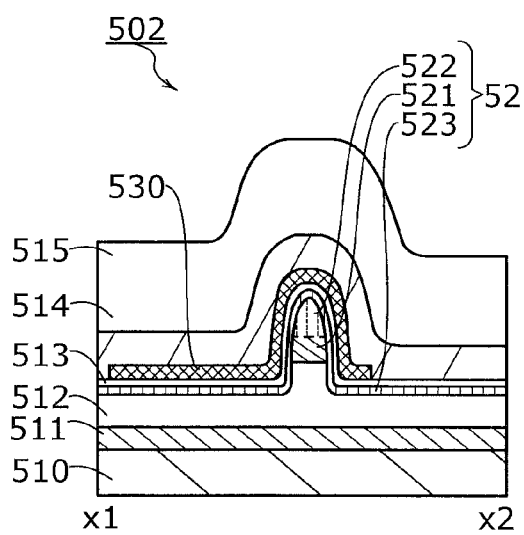
Figure 12D:
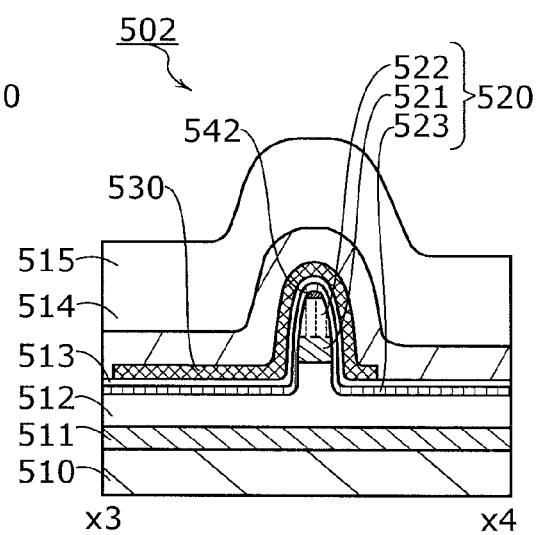
Figure 13A:
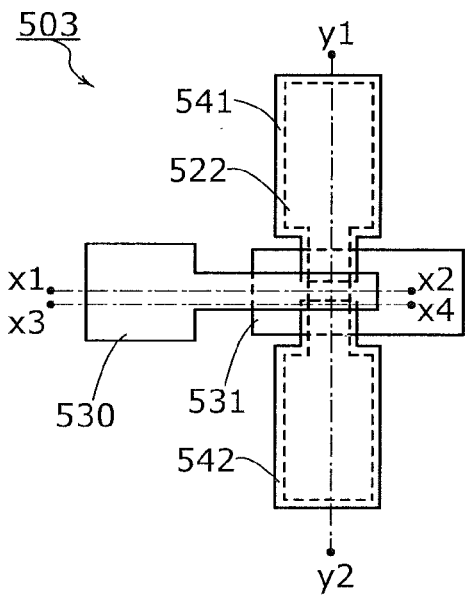
FIGS. 13A to 13D illustrate a structure example of an OS transistor.
Figure 13B:
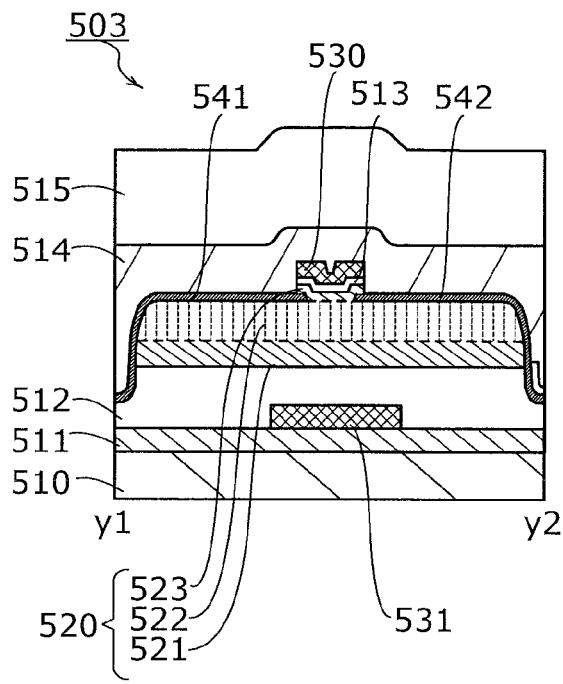
Figure 13C:
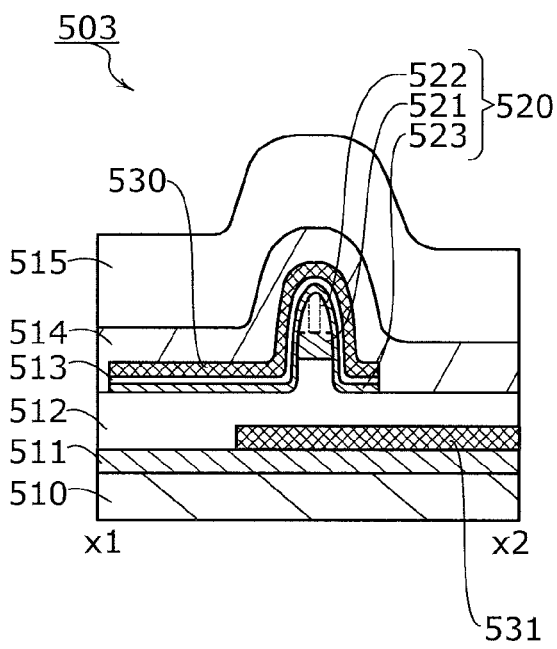
Figure 13D:
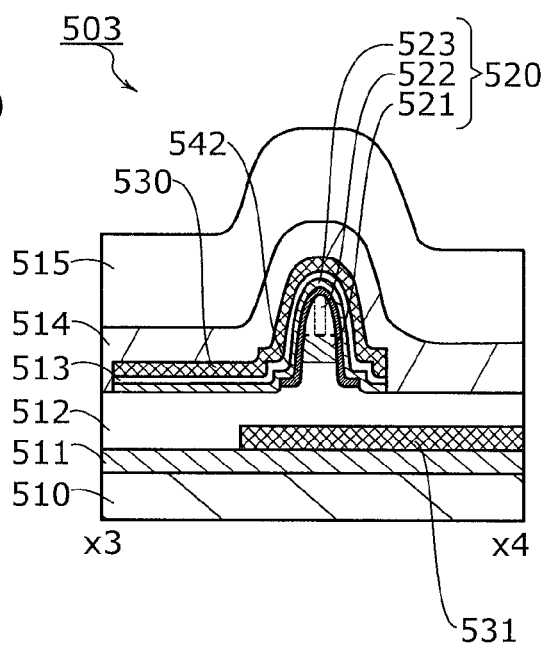
Figure 14A:
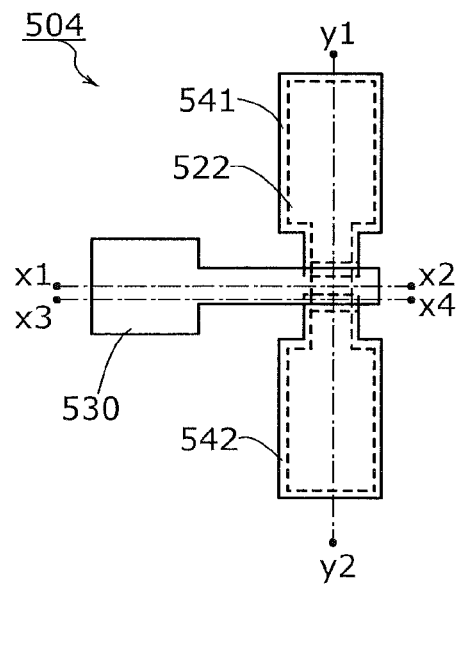
FIGS. 14A to 14D illustrate a structure example of an OS transistor.
Figure 14B:
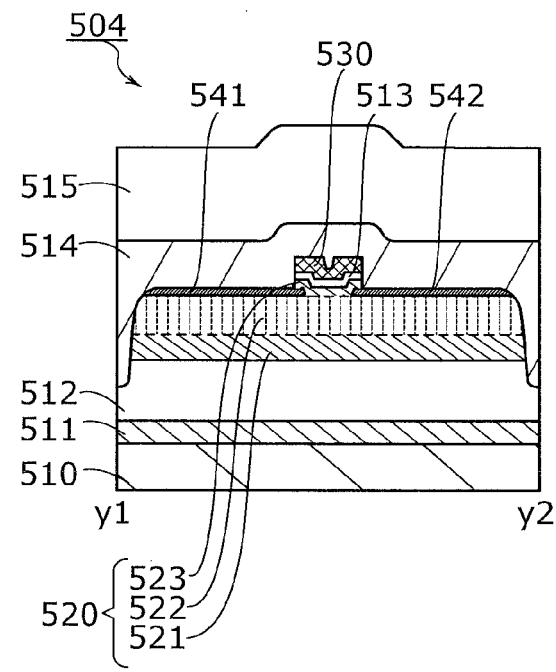
Figure 14C:
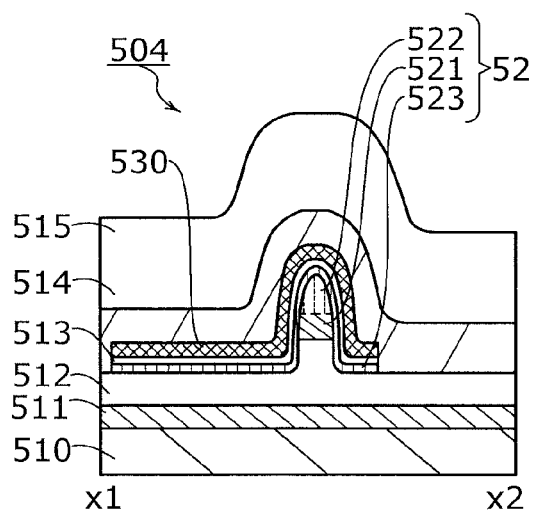
Figure 14D:
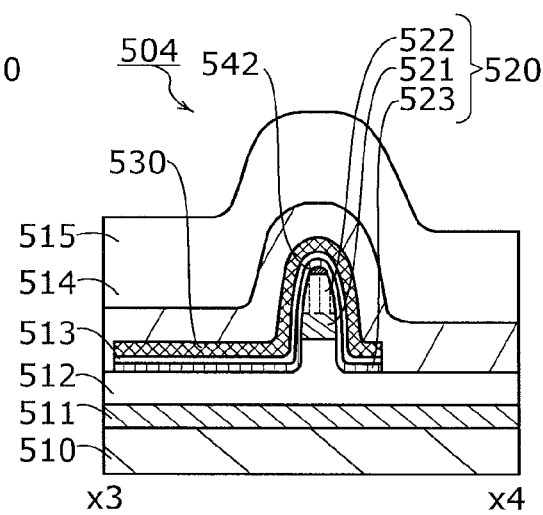
Figure 15A:
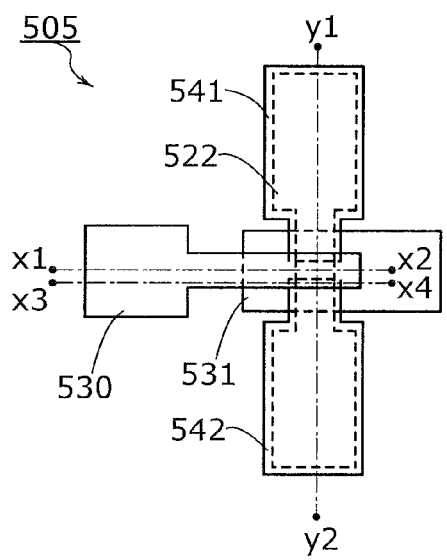
FIGS. 15A to 15D illustrate a structure example of an OS transistor.
Figure 15B:
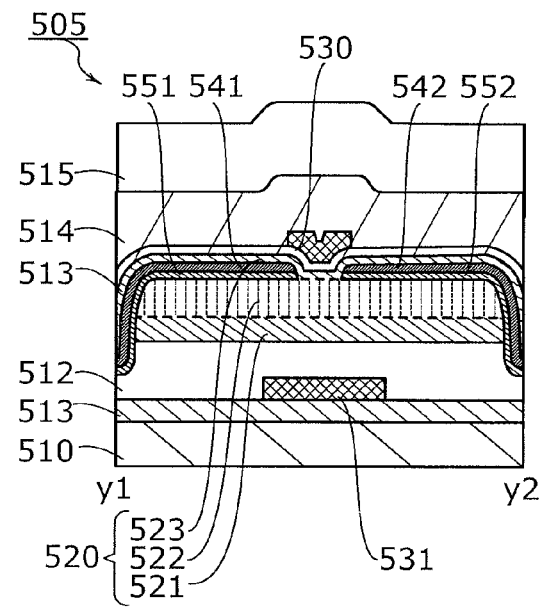
Figure 15C:
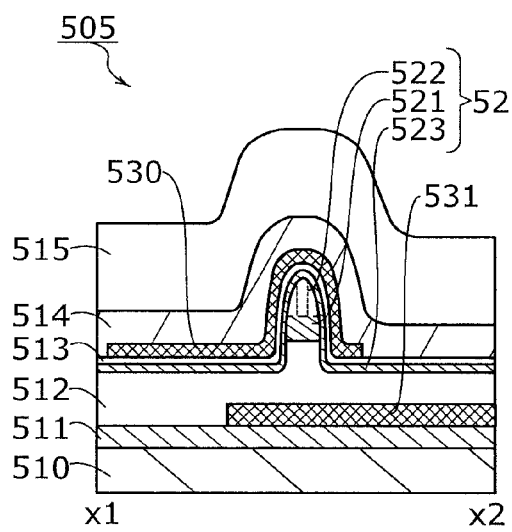
Figure 15D:
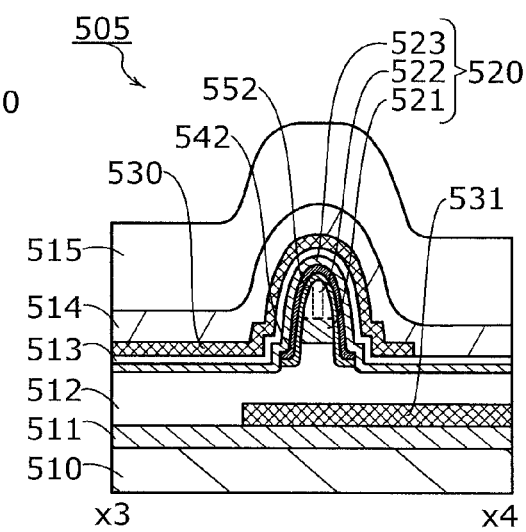
Figure 16A:
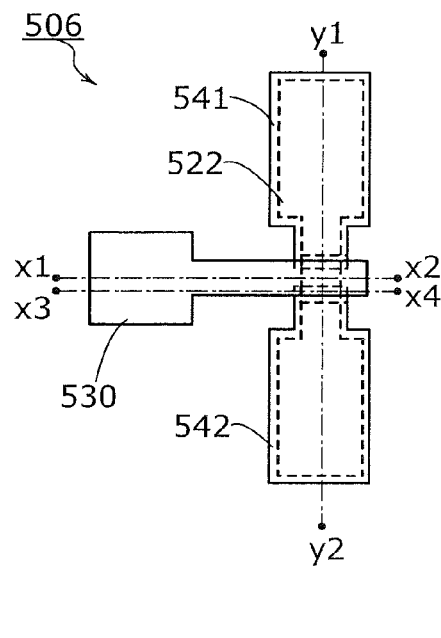
FIGS. 16A to 16D illustrate a structure example of an OS transistor.
Figure 16B:
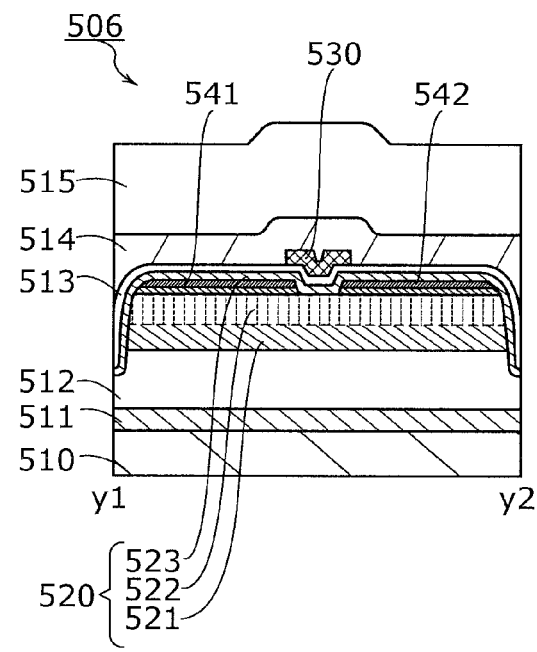
Figure 16C:
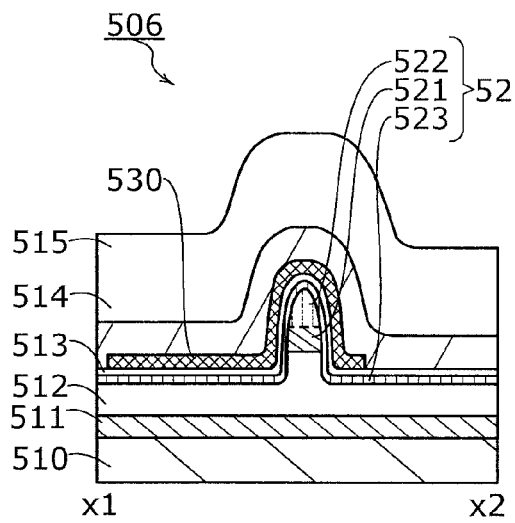
Figure 16D:
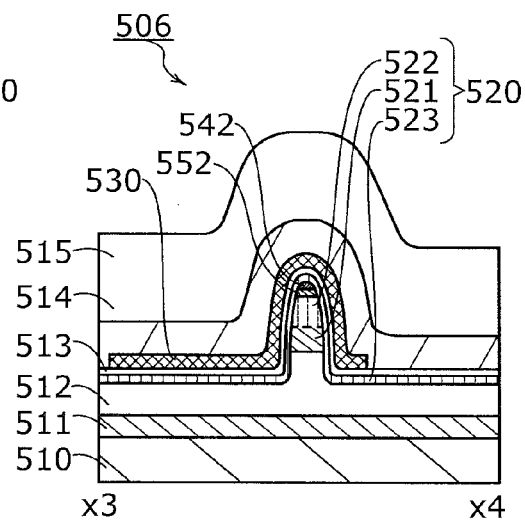

An OS transistor 502 illustrated in FIGS. 12A to 12D is a modification example of the OS transistor 501. FIG. 12A is a plan view of the OS transistor 502. FIG. 12B is a cross-sectional view taken along a line y1-y2, FIG. 12C is a cross-sectional view taken along a line x1-x2, and FIG. 12D is a cross-sectional view taken along a line x3-x4. Note that to clarify the device structure, FIG. 12A does not illustrate some components.

Like the OS transistor 501, the OS transistor 502 illustrated in FIGS. 12A to 12D also has the s-channel structure. The OS transistor 502 does not include the conductive layer 531 and is different from the OS transistor 501 in the shapes of the conductive layer 541 and the conductive layer 542. The conductive layer 541 and the conductive layer 542 in the OS transistor 502 are formed from a hard mask used for forming the stacked film of the OS layer 521 and the OS layer 522. Therefore, the conductive layer 541 and the conductive layer 542 are not in contact with the side surfaces of the OS layer 521 and the OS layer 522 (FIG. 12D).

Through the following steps, the OS layers 521 and 522 and the conductive layers 541 and 542 can be formed. A two-layer oxide semiconductor film including the OS layers 521 and 522 is formed. A single-layer or stacked-layer conductive film is formed over the oxide semiconductor film. This conductive film is etched, so that a hard mask is formed. Using this hard mask, the two-layer oxide semiconductor film is etched to form the OS layers 521 and 522. Then, the hard mask is etched to form the conductive layer 541 and the conductive layer 542.

<Structure Examples 3 and 4 of OS Transistor>

An OS transistor 503 illustrated in FIGS. 13A to 13D is a modification example of the OS transistor 501, and an OS transistor 504 illustrated in FIGS. 14A to 14D is a modification example of the OS transistor 502. In each of the OS transistors 503 and 504, the OS layer 523 and the insulating layer 513 are etched using the conductive layer 530 as a mask. Thus, an edge of the OS layer 523 and an edge of the insulating layer 513 are substantially aligned with an edge of the conductive layer 530.

<Structure Examples 5 and 6 of OS Transistor>

An OS transistor 505 illustrated in FIGS. 15A to 15D is a modification example of the OS transistor 501, and an OS transistor 506 illustrated in FIGS. 16A to 16D is a modification example of the OS transistor 502. The OS transistors 505 and 506 each include a layer 551 between the OS layer 523 and the conductive layer 541 and a layer 552 between the OS layer 523 and the conductive layer 542.

The layers 551 and 552 can each be formed using a layer of a transparent conductor, an oxide semiconductor, a nitride semiconductor, or an oxynitride semiconductor, for example. The layers 551 and 552 can each be formed using an n-type oxide semiconductor layer or a conductive layer which has a higher resistance than the conductive layers 541 and 542. The layers 551 and 552 may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Any of these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in electrical characteristics of the transistor due to stray light.

As each of the layers 551 and 552, a layer which does not form a Schottky barrier with the OS layer 523 is preferably used. Thus, on-state characteristics of the OS transistors 505 and 506 can be improved.

The layers 551 and 552 are each preferably a layer that has a higher resistance than the conductive layers 541 and 542. The layers 551 and 552 each preferably have resistance lower than the channel resistance of the transistor. For example, the layers 551 and 552 may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 551 and 552 (e.g., the layer on the drain side) may preferably be provided.

The components of the OS transistors 501 and 502 are described below.

<Oxide Semiconductor Layer>

As the semiconductor material of the OS layers 521 to 523, typically, an In—Ga oxide, an In—Zn oxide, or an In-M-Zn oxide (M is Ga, Y, Zr, La, Ce, or Nd) is used. In addition, the OS layers 521 to 523 are not limited to the oxide layers containing indium. The OS layers 521 to 523 can be a Zn—Sn oxide layer, a Ga—Sn oxide layer, a Zn—Mg oxide layer, for example. The OS layer 522 is preferably formed using an In-M-Zn oxide. Each of the OS layers 521 and 523 is preferably formed using a Ga oxide.

A case where the OS layers 521 to 523 are formed using In-M-Zn oxide films formed by a sputtering method is described. The atomic ratio of metal elements of a target for the deposition of an In-M-Zn oxide that is used for forming the OS layer 522 is In:M:Zn=$x_1$:$y_1$:$z_1$. The atomic ratio of metal elements of a target that is used for forming the OS layer 521 and the OS layer 523 is In:M:Zn=$x_2$:$y_2$:$z_2$.

For forming the OS layer 522, a polycrystalline target of an In-M-Zn oxide in which $x_1/y_1$ is greater than or equal to ⅓ and less than or equal to 6, or greater than or equal to 1 and less than or equal to 6, and $z_1/y_1$ is greater than or equal to ⅓ and less than or equal to 6, or greater than or equal to 1 and less than or equal to 6 is preferably used. Note that when $z_1/y_1$ is greater than or equal to 1 and less than or equal to 6, a CAAC-OS film is easily formed. Typical examples of the atomic ratio of the metal elements in the target include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:2:4.1. Note that the CAAC-OS is an oxide semiconductor including a c-axis aligned crystal part, and is described later. It is preferable that the CAAC-OS film have no spinel crystal structure in particular. Thus, the reliability and electrical characteristics of the transistor including the CAAC-OS film can be improved.

In the target used for forming the OS layers 521 and 523, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film is easily formed. Typical examples of the atomic ratio of the metal elements in the target include In:M:Zn=1:3:2, In:M:Zn 1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

In the In-M-Zn oxide film, the proportions of atoms in the atomic ratio vary within a range of ±40% as an error. For example, the atomic ratio of metal elements contained in an oxide semiconductor film deposited using an oxide target of In:M:Zn=4:2:4.1 is approximately In:M:Zn=4:2:3.

<Energy Band Structure>

Figure 17A:
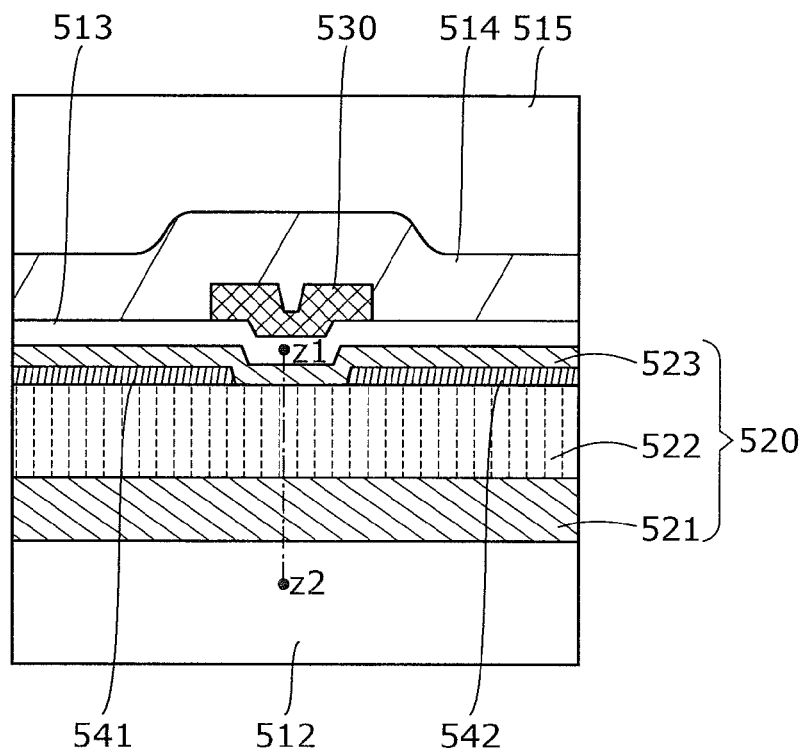
FIG. 17A is an enlarged view of a portion in FIG. 12B.
Figure 17B:
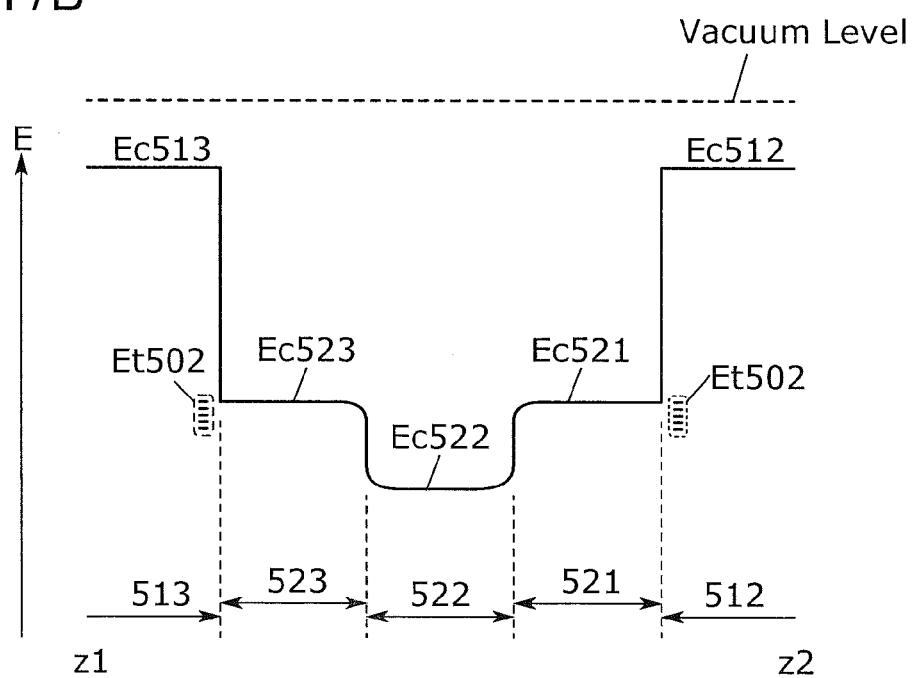
FIG. 17B is an energy band diagram of an OS transistor.

Next, a function and an effect of the OS layer 520 in which the OS layers 521, 522, and 523 are stacked are described using an energy band diagram in FIG. 17B. FIG. 17A is an enlarged view of a channel region of the OS transistor 502 illustrated in FIG. 12B. FIG. 17B shows an energy band diagram of a portion taken along a dotted line z1-z2 (the channel formation region of the OS transistor 502) in FIG. 17A. The OS transistor 502 is described below as an example, but the same can apply to the OS transistor 501 and the OS transistors 503 to 506.

In FIG. 17B, Ec512, Ec521, Ec522, Ec523, and Ec513 indicate the energy of the conduction band minimum of the insulating layer 512, the OS layer 521, the OS layer 522, the OS layer 523, and the insulating layer 513, respectively.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as an ionization potential). Note that the energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the OS layers 521, 522, and 523).

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the OS layer 521 and the OS layer 522 and the interface between the OS layer 522 and the OS layer 523; thus, the energy at the bottom of the conduction band changes continuously. In other words, no state or few states exist at these interfaces.

Accordingly, electrons transfer mainly through the OS layer 522 in the stacked-layer structure having the above energy band structure. Therefore, even if an interface state exists at the interface between the OS layer 521 and the insulating layer 512 or the interface between the OS layer 523 and the insulating layer 513, the interface state hardly influences the transfer of electrons. In addition, since no interface state or few interface states exist at the interface between the OS layer 521 and the OS layer 522 and the interface between the OS layer 523 and the OS layer 522, the transfer of electrons is not interrupted in the region. Consequently, the transistor 502 including the above stacked oxide semiconductors can have high field-effect mobility.

Although trap states Et502 due to impurities or defects might be formed in the vicinity of the interface between the OS layer 521 and the insulating layer 512 and the interface between the OS layer 523 and the insulating layer 513 as illustrated in FIG. 17B, the OS layer 522 can be separated from the trap states owing to the existence of the OS layers 521 and 523.

In the transistor 502, in the channel width direction, the top surface and side surfaces of the OS layer 522 are in contact with the OS layer 523, and the bottom surface of the OS layer 522 is in contact with the OS layer 521 (see FIG. 12C). Surrounding the OS layer 522 by the OS layers 521 and 523 in this manner can further reduce the influence of the trap states.

However, when the energy difference between Ec522 and Ec521 or Ec523 is small, an electron in the OS layer 522 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy gaps between Ec521 and Ec522 and between Ec522 and Ec523 is preferably 0.1 eV or more, or further preferably 0.15 eV or more, in which case a change in the threshold voltage of the transistor can be reduced and the transistor can have favorable electrical characteristics.

The band gap of each of the OS layers 521 and 523 is preferably wider than that of the OS layer 522.

For the OS layers 521 and 523, a material containing Ga, Y, Zr, La, Ce, or Nd with a higher atomic ratio than that used for the OS layer 522 can be used, for example. Specifically, any of the above metal elements with an atomic ratio 1.5 times or more, preferably 2 times or more, or further preferably 3 times or more as high as the metal element in the OS layer 522 is contained. Any of the above metal elements is strongly bonded to oxygen and thus has a function of suppressing generation of an oxygen vacancy in the oxide semiconductor. That is, an oxygen vacancy is less likely to be generated in the OS layers 521 and the 523 than in the OS layer 522.

When the OS layers 521, 522, and 523 are In-M-Zn oxides containing at least indium, zinc, and M (M is Ga, Y, Zr, La, Ce, or Nd) and the atomic ratio of In to M and Zn of the OS layer 521 is $x_1:y_1:z_1$, that of the OS layer 522 is $x_2:y_2:z_2$, and that of the OS layer 523 is $x_3:y_3:z_3$, $y_1/x_1$ and $y_3/x_3$ are preferably larger than $y_2/x_2$. Furthermore, $y_1/x_1$ and $y_3/x_3$ are 1.5 times or more as large as $y_2/x_2$, preferably 2 times or more as large as $y_2/x_2$, or further preferably 3 times or more as large as $y_2/x_2$. In this case, the transistor can have stable electrical characteristics when $y_2$ is greater than or equal to $x_2$ in the OS layer 522. However, when $y_2$ is three times or more as large as $x_2$, the field-effect mobility of the transistor is reduced; accordingly, $y_2$ is preferably smaller than 3 times $x_2$.

An In-M-Zn oxide film satisfying the above conditions can be formed using an In-M-Zn oxide target satisfying the above atomic ratio of metal elements.

In the case where Zn and O are not taken into consideration, the proportion of In and the proportion of M in the OS layer 521 and the OS layer 523 are preferably less than 50 atomic % and greater than 50 atomic %, respectively, or further preferably less than 25 atomic % and greater than 75 atomic %, respectively. In the case where Zn and O are not taken into consideration, the proportion of In and the proportion of M in the OS layer 522 are preferably greater than 25 atomic % and less than 75 atomic %, respectively, or further preferably greater than 34 atomic % and less than 66 atomic %, respectively.

Furthermore, at least one of the OS layers 521 and 523 does not necessarily contain indium in some cases. For example, the OS layer 521 and/or the OS layer 523 can be formed using a gallium oxide film.

The thickness of each of the OS layers 521 and 523 is greater than or equal to 3 nm and less than or equal to 100 nm, or preferably greater than or equal to 3 nm and less than or equal to 50 nm. The thickness of the OS layer 522 is greater than or equal to 3 nm and less than or equal to 200 nm, preferably greater than or equal to 3 nm and less than or equal to 100 nm, or further preferably greater than or equal to 3 nm and less than or equal to 50 nm. The OS layer 523 is preferably thinner than the OS layers 521 and 522.

Note that in order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to the state where an oxide semiconductor has a carrier density lower than $1\times10^{17}/cm^3$, preferably lower than $1\times10^{15}/cm^3$, or further preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity level becomes a trap, which might deteriorate the electrical characteristics of the transistor. Therefore, it is preferable to reduce the concentration of the impurities in the OS layers 521, 522, and 523 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1\times10^{19}$ atoms/$cm^3$, preferably lower than $5\times10^{18}$ atoms/$cm^3$, or further preferably lower than $1\times10^{18}$ atoms/$cm^3$. The concentration of hydrogen at a certain depth of the oxide semiconductor or in a certain region of the oxide semiconductor is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, or still further preferably lower than or equal to $5\times10^{18}$ atoms/$cm^3$. The concentration of nitrogen at a certain depth of the oxide semiconductor or in a certain region of the oxide semiconductor is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, or still further preferably lower than or equal to $5\times10^{17}$ atoms/$cm^3$.

In addition, in the case where the oxide semiconductor includes a crystal, the crystallinity of the oxide semiconductor might be decreased if silicon or carbon is included at high concentration. In order not to lower the crystallinity of the oxide semiconductor, for example, the concentration of silicon at a certain depth of the oxide semiconductor or in a certain region of the oxide semiconductor is lower than $1\times10^{19}$ atoms/$cm^3$, preferably lower than $5\times10^{18}$ atoms/$cm^3$, or further preferably lower than $1\times10^{18}$ atoms/$cm^3$. Furthermore, the concentration of carbon at a certain depth of the oxide semiconductor or in a certain region of the oxide semiconductor is lower than $1\times10^{19}$ atoms/$cm^3$, preferably lower than $5\times10^{18}$ atoms/$cm^3$, or further preferably lower than $1\times10^{18}$ atoms/$cm^3$, for example.

A transistor in which a highly purified oxide semiconductor is used for a channel formation region as described above has an extremely low off-state current. In the case where the voltage between a source and a drain is set at approximately 0.1 V, 5 V, or 10 V, for example, the off-state current standardized on the channel width of the transistor can be as low as several yoctoamperes per micrometer to several zeptoamperes per micrometer.

<Crystal Structure of Oxide Semiconductor Film>

A structure of an oxide semiconductor film that forms the OS layer 520 is described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to □ □° and less than or equal to 120°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

(CAAC-OS Film)

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an $InGaZnO_4$ crystal by an out-of-plane method, another peak may appear when 2θ is around 36°, in addition to the peak at 2θ of around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus has a low carrier density in some cases. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics.

In an OS transistor using the CAAC-OS film, change in electric characteristics of the transistor due to irradiation with visible light or ultraviolet light is small.

(Microcrystalline Oxide Semiconductor Film)

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

(Amorphous Oxide Semiconductor Film)

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found. When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In this manner, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the InGaZnO$_4$ crystal, focusing on the lattice fringes in the high-resolution TEM image.

The film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition as the oxide semiconductor film. For example, the film density of the a-like OS film is higher than or equal to 78.6% and lower than 92.3% of the film density of the single crystal oxide semiconductor film having the same composition. For example, the film density of the nc-OS film and the CAAC-OS film is higher than or equal to 92.3% or and lower than 100% of the film density of the single crystal oxide semiconductor film having the same composition. Note that it is difficult to form an oxide semiconductor film having a film density of lower than 78% of the film density of the single crystal oxide semiconductor film having the same composition.

Specific examples of the above description are given. For example, in the case of an oxide semiconductor film having an atomic ratio of In:Ga:Zn=1:1:1, the film density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the film density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the film density of each of the nc-OS film and the CAAC-OS film is higher than or equal to 5.9 g/cm$^3$ and lower than 6.3 g/cm$^3$.

Note that there is a possibility that an oxide semiconductor film having a certain composition cannot exist in a single crystal structure. In that case, single crystal oxide semiconductor films with different compositions are combined in an adequate ratio to calculate the density equivalent to that of a single crystal oxide semiconductor film with the desired composition. The film density of the single crystal oxide semiconductor film having the desired composition can be calculated using a weighted average according to the combination ratio of the single crystal oxide semiconductor films with different compositions. Note that it is preferable to combine as few kinds of single crystal oxide semiconductor films as possible for film density calculation.

Note that an oxide semiconductor film may be a stacked film including two or more of an amorphous oxide semiconductor film, an a-like OS film, a microcrystalline oxide semiconductor film, and a CAAC-OS film, for example.

<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the OS layer 520. For this reason, the insulating layer 512 is preferably an insulating film containing oxygen, further preferably, an insulating film containing oxygen in which the oxygen content is higher than that in the stoichiometric composition. For example, a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) treatment so as to have a flat surface.

The insulating layers 511 and 512 can be formed using an insulating material of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, silicon nitride, silicon nitride oxide, aluminum nitride oxide, or the like, or a mixed material of these materials. In this specification, oxynitride refers to a material which includes more oxygen than nitrogen, and nitride oxide refers to a substance which includes more nitrogen than oxygen.

<Gate Electrode>

The conductive layer 530 is preferably formed using a metal such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy mainly containing any of these materials; or a compound mainly containing any of these materials.

The conductive layer 530 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

<Gate Insulating Layer>

The insulating layer 513 is formed using an insulating film having a single-layer structure or a stacked-layer structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably includes hafnium oxide, and silicon oxide or silicon oxynitride.

Hafnium oxide has a higher dielectric constant than silicon oxide and silicon oxynitride. Therefore, the physical thickness can be made large as compared with silicon oxide; thus, leakage current due to tunnel current can be low. That is, a transistor with a low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with a low off-state current. Examples of the crystal structure include a monoclinic crystal structure and a cubic crystal structure. Note that one embodiment of the present invention is not limited to the above examples.

<Source Electrode, Drain Electrode, Back Gate Electrode>

The conductive layers 541 and 542 and the conductive layer 531 can be formed in a manner similar to that of the conductive layer 530. A Cu—Mn alloy film is preferably used for the conductive layers 541 and 542 because of its low electrical resistance and because it forms manganese oxide at the interface with the OS layer 520 and manganese oxide can prevent Cu diffusion.

<Protective Insulating Film>

The insulating layer 514 preferably has a function of blocking oxygen, hydrogen, water, an alkali metal, an alkaline earth metal, and the like. The provision of the insulating layer 514 can prevent outward diffusion of oxygen from the OS layer 520 and entry of hydrogen, water, or the like into the OS layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 520, preventing release of oxygen, which is the main component of the OS layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a layered structure. The insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<<Deposition Method>>

A sputtering method and a plasma-enhanced chemical vapor deposition method are typical examples of a method of forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as a thermal CVD method, for example.

A thermal CVD method does not generate plasma and thus has an advantage that no defect due to plasma damage is caused. Deposition by a thermal CVD method may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, an ALD method makes it possible to accurately adjust thickness and thus is suitable for manufacturing a minute FET.

The conductive film and the semiconductor film that are described in the above embodiment can be formed by a thermal CVD method such as a MOCVD method or an ALD method. For example, in the case where an $InGaZnO_X$ (X>0) film is foHned, trimethylindium, trimethylgallium, and diethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and dimethylzinc (chemical formula: $(CH_3)_2Zn$) can be used instead of diethylzinc.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced at the same time, so that a tungsten film is formed. Note that an $SiH_4$ gas may be used instead of a $B_2H_6$ gas.

For example, in the case where an oxide semiconductor film, for example, an $InGaZnO_X$ (X>0) film is formed using a deposition apparatus employing ALD, an $(CH_3)_3In$ gas and an $O_3$ gas are sequentially introduced more than once to form an $InO_2$ layer, a $(CH_3)_3Ga$ gas and an $O_3$ gas are introduced at the same time to form a GaO layer, and then a $(CH_3)_2Zn$ gas and an $O_3$ gas are introduced at the same time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Note that although an $H_2O$ gas that is obtained by bubbling with an inert gas such as Ar may be used instead of an $O_3$ gas, it is preferable to use an $O_3$ gas, which does not contain H. Instead of an $(CH_3)_3In$ gas, an $(C_2H_5)_3In$ gas may be used. Instead of a $(CH_3)_3Ga$ gas, a $(C_2H_5)_3Ga$ gas may be used. Furthermore, a $(CH_3)_2Zn$ gas may be used.

Embodiment 3

In this embodiment, a semiconductor device structure is described. As described in Embodiment 1, a semiconductor device can be formed with a Si transistor and an OS transistor. The semiconductor device with such a structure can be reduced in size by stacking a Si transistor and an OS transistor. A structure example of the semiconductor device with such a stacked-layer structure is described with reference to FIG. 18.

Figure 18:
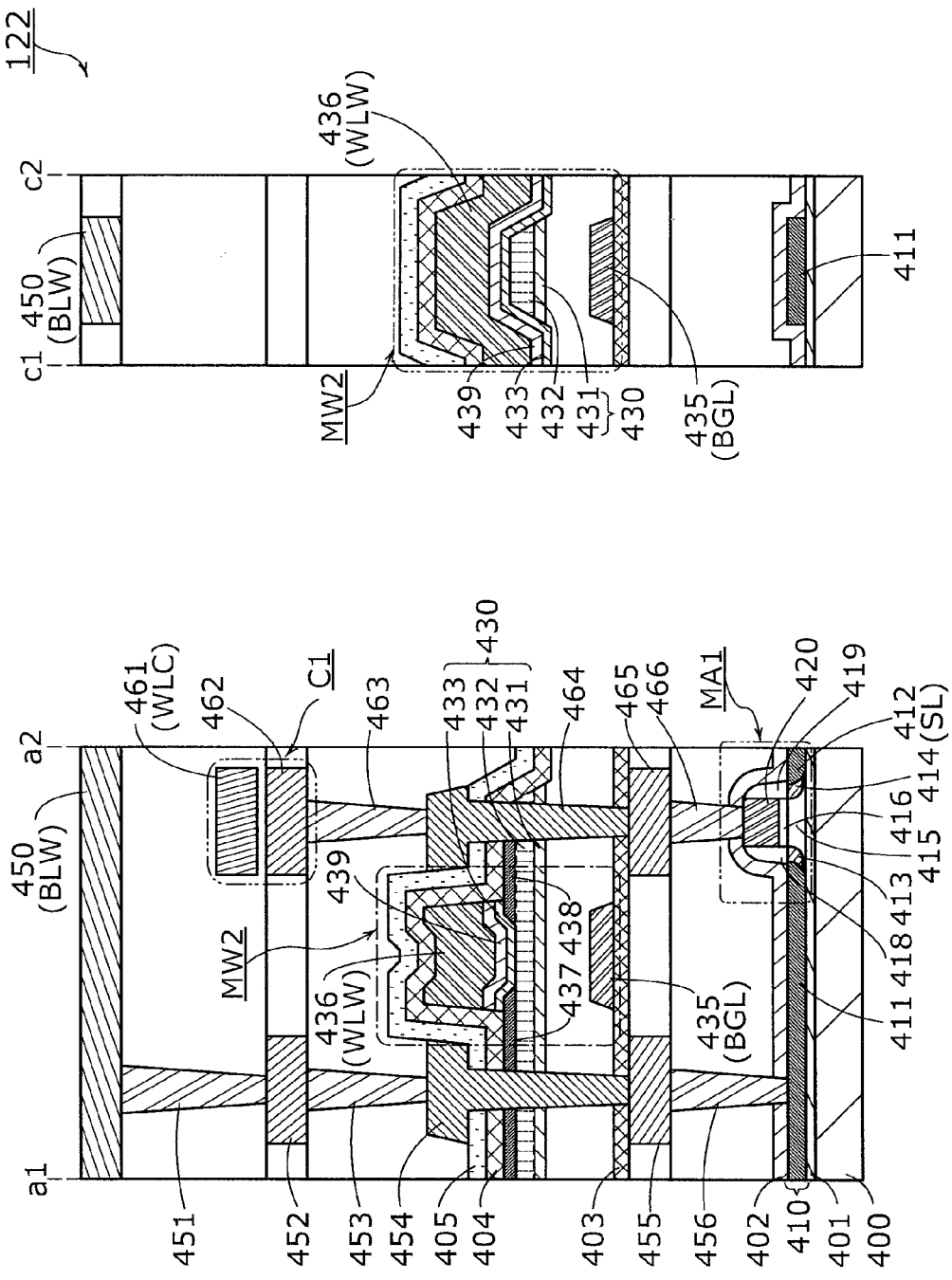
FIG. 18 is cross-sectional views illustrating an example of the device structure of a memory device.

The device structure of the memory device 10 is described as an example of the semiconductor device. Typically, the memory cell 122 (FIG. 2B) is used as an example for describing the device structure of the memory device 10. FIG. 18 is a cross-sectional view illustrating a structure example of the memory cell 122. In FIG. 18, a section a1-a2 shows a cross-sectional structure of the transistor MW1 and a transistor MA2 in the channel length direction, and a section c1-c2 shows a cross-sectional structure of the transistor MW2 in the channel width direction.

In FIG. 18, regions where reference numerals and hatching patterns are not given show regions formed using an insulator. The region can be formed using an insulator containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, in these regions, an organic resin such as a polyimide resin, a polyamide resin, an acrylic resin, a siloxane resin, an epoxy resin, or a phenol resin can be used.
<Transistor MA1>

Here, a planar-type field-effect transistor is used as the transistor MA1. The transistor MA1 is manufactured using an SOI semiconductor substrate including a single crystal silicon layer. A substrate 400 is a substrate (e.g., a single crystal silicon substrate) that supports the single crystal silicon layer. An insulating layer 401 is a buried oxide layer (BOX layer) for insulating the single crystal silicon layer from the substrate 400. Needless to say, a Si transistor such as the transistor MA1 can be manufactured using a bulk-type single crystal silicon substrate. Moreover, the device structure of the transistor MA1 is not limited to the example of FIG. 18. For example, a 3D transistor formed utilizing an projection portion of a semiconductor substrate (e.g., a fin-type transistor or a Tri-gate type transistor) can be employed.

The transistor MA1 includes a Si layer 410, a gate insulating layer 416, and a conductor 420. In the Si layer 410, impurity regions 411, 412, 413, and 414 and a channel formation region 415 are formed. The impurity regions 411 and 412 each function as a source region or a drain region. The impurity regions 413 and 414 each function as a lightly doped drain (LDD) region or an extension region. Here, the conductivity type of each of the impurity regions 411 to 414 is an p-type. The impurity region 412 has a region functioning as a wiring SL. The conductor 420 has a region functioning as a gate electrode of the transistor MAL Insulating layers 418 and 419 are formed on the side surfaces of the conductor 420. The impurity regions 411 to 414 can be formed in the Si layer 410 in a self-aligned manner by the formation of the insulating layers 418 and 419. The transistor MA1 is covered with an insulating layer 402.
<Transistor MW2>

The transistor MW2 has a device structure similar to that of the OS transistor 504 including a back gate. The device structure of the transistor MW2 is not limited thereto.

The transistor MW2 is formed over an insulating layer 403. The transistor MW2 includes an OS layer including a channel formation region, a conductor 435, a conductor 436, conductors 437 and 438, and a gate insulating layer 439. The transistor MW2 is covered with an insulating layer 404 and an insulating layer 405. The OS layer 430 of the transistor MW2 has a three-layer structure of OS layers 431 to 433, which is similar to a three-layer structure of the OS transistor 502 (FIGS. 12A to 12D). The conductor 435 has a region functioning as a back gate electrode of the transistor MW2 and the wiring BGL. The conductor 436 has a region functioning as a gate electrode of the transistor MW2 and the wiring WWL. The conductors 437 and 438 each function as a source electrode or a drain electrode of the transistor MW2.

The insulating layer 403 serving as a base insulating layer of the transistor MW2 is preferably formed using an insulator having a function of preventing diffusion of hydrogen from a lower layer to the OS layer 430. This has an effect of improving reliability of the Si transistor by terminating dangling bonds of silicon in the Si layer by hydrogen. In contrast, as described above, hydrogen serves as an impurity that reduces reliability of the OS layer in the OS transistor. Thus, the insulating layer 403 confines hydrogen in the lower layer and diffuses hydrogen from the lower layer to an upper layer, so that reliability of both the transistor MA1 (Si transistor) and the transistor MW2 (OS transistor) can be improved. The insulating layer 403 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example. In particular, an aluminum oxide film is preferably used because the aluminum oxide film has a high shielding (blocking) effect of preventing transmission of both oxygen and impurities such as hydrogen and moisture.

A conductor 450 has a region functioning as a wiring BL. The conductor 450 is electrically connected to the conductor 437 of the transistor MW2 through conductors 451 to 454.

The conductor 450 is also electrically connected to the impurity region 411 of the transistor MA1 through the conductors 451 to 454 and conductors 455 and 456.

<Capacitor C1>

A region in which a conductor 461 and a conductor 462 overlap each other with a dielectric provided therebetween functions as the capacitor C1. The conductor 461 has a region functioning as a wiring RWL. The conductor 462 is electrically connected to the gate electrode (the conductor 420) of the transistor MA1 through conductors 463 to 466.

FIG. 18 indicates that the circuits included in the memory device 10 can be formed through a process for forming the transistor MA1. Thus, according to one embodiment of the present invention, a combined memory (combined RAM) which is capable of writing data at low voltage and which has reduced frequency of refresh can be provided.

Embodiment 4

In this embodiment, a memory device as an example of a semiconductor device and a processing unit that processes data stored in the memory device are described.

<<CPU>>

Figure 19:
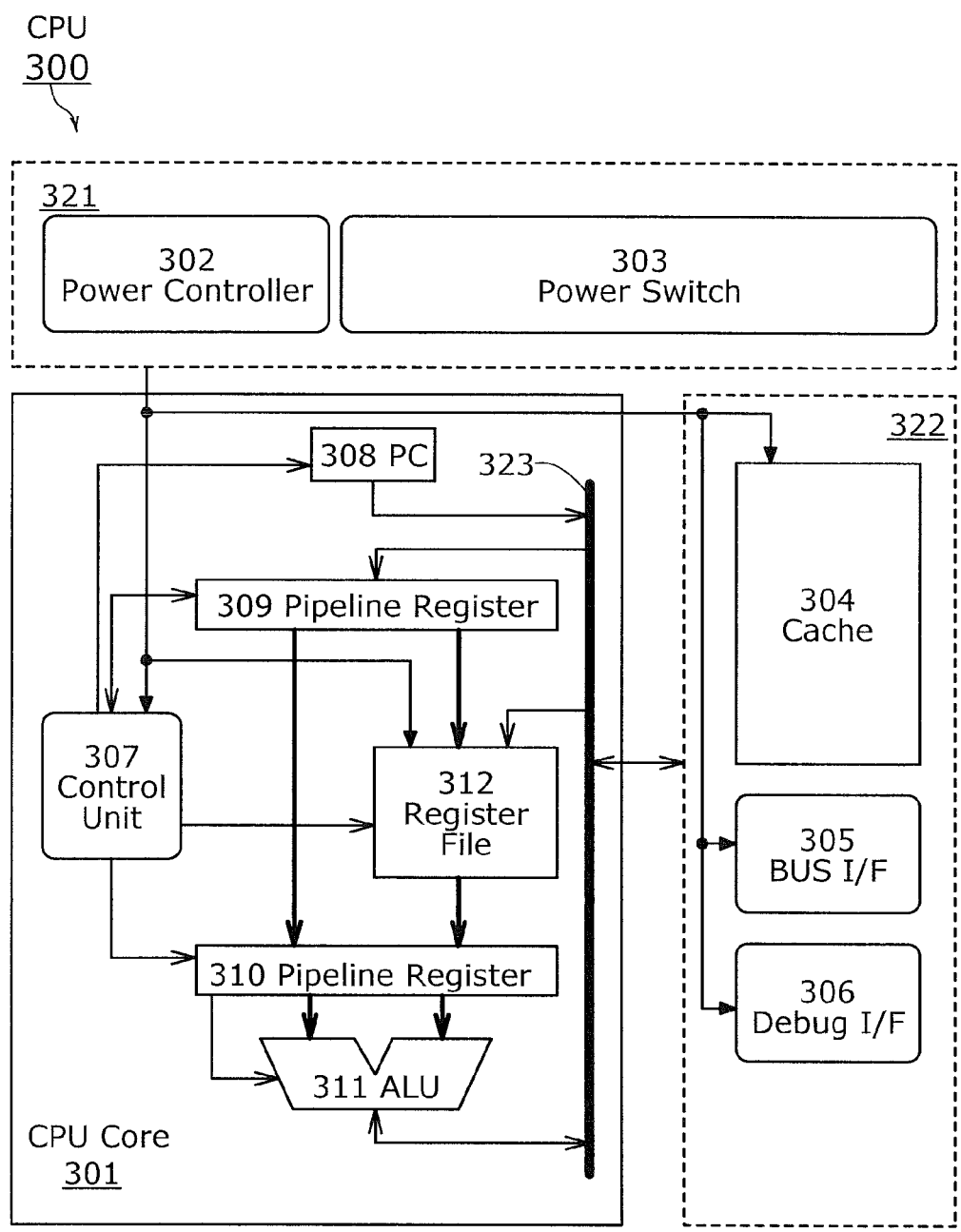
FIG. 19 is a block diagram illustrating an example of a processing unit (CPU).

FIG. 19 illustrates a CPU configuration example. A CPU 300 illustrated in FIG. 19 includes a CPU core 301, a power management unit 321, and a peripheral circuit 322. The power management unit 321 includes a power controller 302 and a power switch 303. The peripheral circuit 322 includes a cache 304 including cache memory, a bus interface (BUS I/F) 305, and a debug interface (Debug I/F) 306. The CPU core 301 includes a data bus 323, a control unit 307, a program counter (PC) 308, a pipeline register 309, a pipeline register 310, an arithmetic logic unit (ALU) 311, and a register file 312. Data is transmitted between the CPU core 301 and the peripheral circuit 322 such as the cache 304 via the data bus 323.

The memory device of one embodiment of the present invention can be used for the cache 304. Consequently, high-speed operation and low power consumption of the cache can be achieved and thus a semiconductor device that operates more rapidly or a semiconductor device with low power consumption can be provided.

The control unit 307 has functions of decoding and executing instructions contained in a program such as inputted applications by controlling the overall operations of the PC 308, the pipeline registers 309 and 310, the ALU 311, the register file 312, the cache 304, the bus interface 305, the debug interface 306, and the power controller 302.

The ALU 311 has a function of performing a variety of arithmetic operations such as four arithmetic operations and logic operations. The cache 304 has a function of temporarily storing frequently used data. The PC 308 is a register having a function of storing an address of an instruction to be executed next. Although not illustrated in FIG. 19, the cache 304 includes a cache controller for controlling the operation of the cache memory.

The pipeline register 309 has a function of temporarily storing instruction data. The register file 312 includes a plurality of registers including a general purpose register and can store data that is read from the main memory, data obtained as a result of arithmetic operations in the ALU 311, or the like. The pipeline register 310 has a function of temporarily storing data used for arithmetic operations performed in the ALU 311, data obtained as a result of arithmetic operations in the ALU 311, or the like.

The bus interface 305 functions as a path for data between the CPU 300 and devices outside the CPU 300. The debug interface 306 functions as a path of a signal for inputting an instruction to control debugging to the CPU 300.

The power switch 303 has a function of controlling supply of the power supply voltage to circuits other than the power controller 302 in the CPU 300. These circuits belong to several different power domains. The power switch 303 controls whether the power supply voltage is supplied to circuits in the same power domain. The power controller 302 has a function of controlling the operation of the power switch 303. With such a configuration, the CPU 300 can perform power gating. An example of the flow of the power gating operation is described.

First, the CPU core 301 sets the timing for stopping the supply of the power supply voltage in a register of the power controller 302. Next, an instruction to start power gating is sent from the CPU core 301 to the power controller 302. Then, the registers and the cache 304 in the CPU 300 start data storing. Subsequently, the power switch 303 stops the supply of the power supply voltage to the circuits other than the power controller 302 in the CPU 300. Then, an interrupt signal is input to the power controller 302, thereby starting the supply of the power supply voltage to the circuits included in the CPU 300. Note that a counter may be provided in the power controller 302 to be used to determine the timing of starting the supply of the power supply voltage regardless of input of an interrupt signal. Next, the registers and the cache 304 start data restoration. After that, execution of an instruction is resumed in the control unit 307.

This power gating can be performed in the entire processor or one or more logic circuits included in the processor. The supply of power can be stopped even for a short time. Accordingly, power consumption can be reduced at a fine granularity in space or time.

In the case where the memory device of one embodiment of the present invention is used in the cache 304, the cache 304 can retain data for a certain period even when the supply of a power supply voltage is stopped. Therefore, when power gating is performed, a period during which data of the cache 304 is stored can be secured easily. Even when the supply of the power supply voltage is suddenly stopped, data in the cache 304 can be stored. In the case where data is stored outside the memory device, the time and power necessary for storing and restoring data is required, while in the case of using the memory device of one embodiment of the present invention, such time and power are not required.

<<RFID Tag>>

An RFID tag is described as an example of a processing unit. The RFID tag is referred to as a wireless tag, an RFID, an RF tag, an ID tag, an IC tag, an IC chip, an electronic tag, a wireless IC tag, and the like. The RFID tag includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example.

Figure 20:
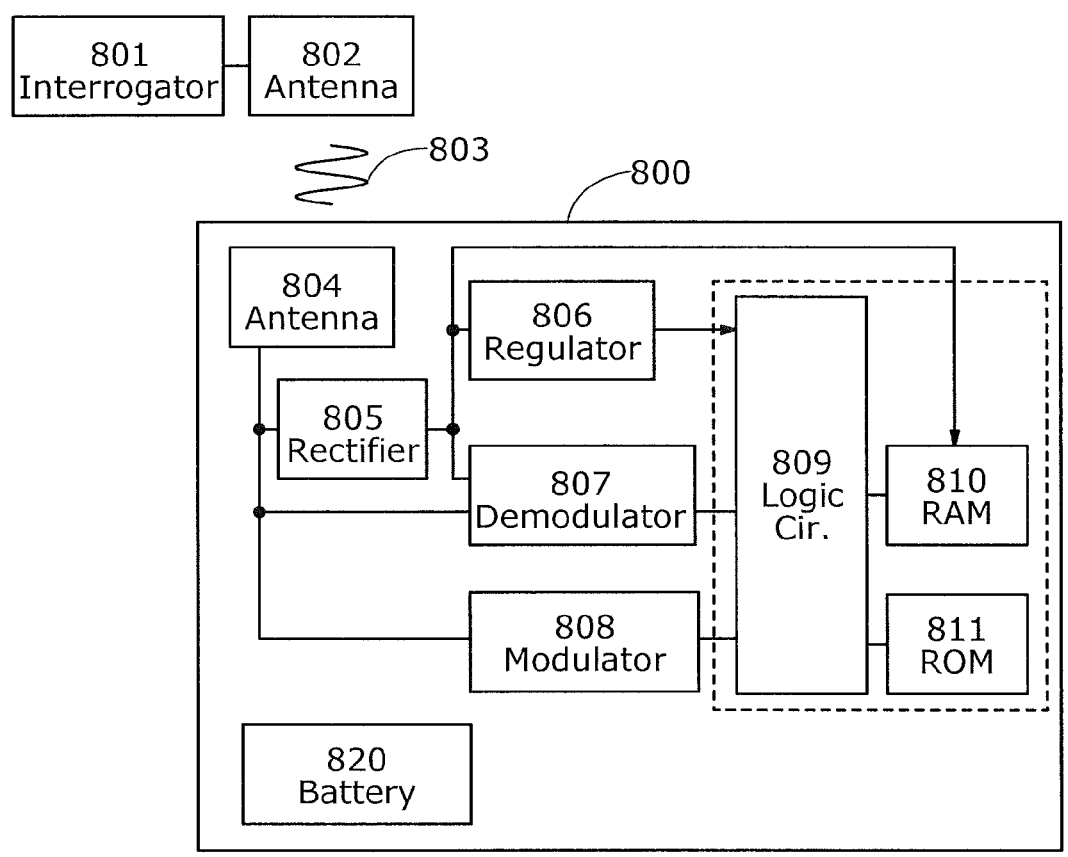
FIG. 20 is a block diagram illustrating an example of a processing unit (RFID tag).

FIG. 20 is a block diagram illustrating an example of an RFID tag. An RFID tag 800 illustrated in FIG. 20 includes an antenna 804, a rectifier circuit 805, a constant voltage circuit 806, a demodulation circuit 807, a modulation circuit 808, a logic circuit 809, a RAM 810, a read-only memory (ROM) 811, and a battery 820. The memory device of one embodiment of the present invention can be used in the RAM 810. Note that decision whether each of these circuits is provided or not can be made as appropriate as needed. For example, although the RFID tag 800 in FIG. 20 is an active type, it may be a passive type without the battery 820.

The memory device according to one embodiment of the present invention has a device structure capable of employing a combined memory. Therefore, in the RFID tag 800, circuits other than the antenna 804 can be incorporated in one IC chip without complicating the manufacturing process. The antenna 804 whose performance corresponds to the communication zone is mounted on the IC chip. Note that as data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment. Although the RFID tag 800 in the example of FIG. 20 is a passive tag, it is needless to say that the RFID tag 800 can be an active wireless tag with a built-in battery.

The memory device of one embodiment of the present invention can be used for the RAM 810. A writing data potential of the RAM 810 can be reduced; therefore, power necessary for the operation of the RFID tag 800 can be reduced, and the communication distance of the RFID tag 800 can be extended.

The antenna 804 exchanges a radio signal 803 with an antenna 802 which is connected to a communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 decodes and processes the demodulated signal. The RAM 810 holds the input data and includes a row decoder, a column decoder, a memory region, and the like. Furthermore, the ROM 811 stores an identification number (ID) or the like and outputs it in accordance with processing.

In the circuits other than the RAM 810, the OS transistors described in Embodiment 2 can be used as n-channel transistors. Since the OS transistors have low off-state currents and high on-state currents, both a low leakage current and high-speed operation can be achieved. Furthermore, the OS transistors may be used as elements having a rectifying function included in the demodulation circuit 807. Since the OS transistors have low off-state currents, the reverse currents of the elements having a rectifying function can be made low, leading to excellent rectification efficiency. Furthermore, since the transistors using an oxide semiconductor can be formed through the same process, high performance of the RFID tag 800 can be achieved without an increase in process cost.

<Application Examples of RFID>

Figure 21A:
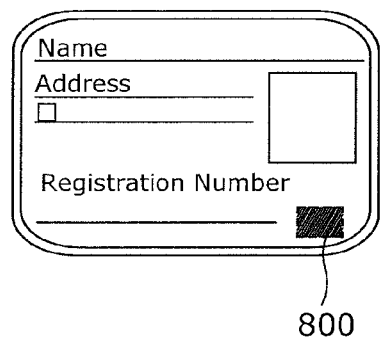
FIGS. 21A to 21F illustrate usage examples of an RFID tag.
Figure 21B:
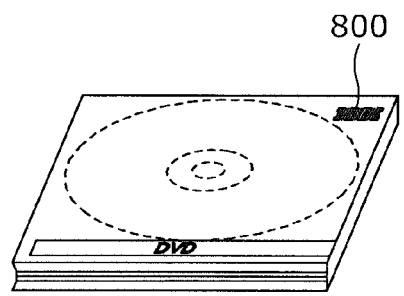
Figure 21C:
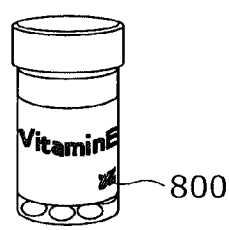
Figure 21D:
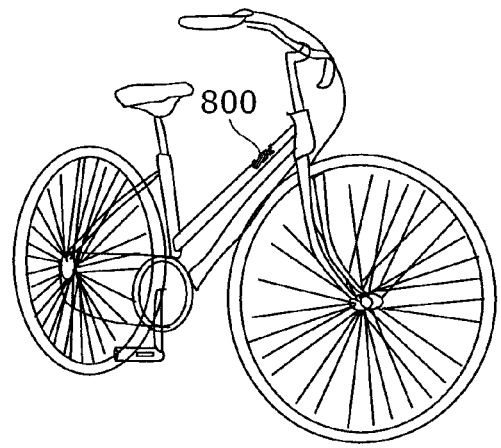
Figure 21E:
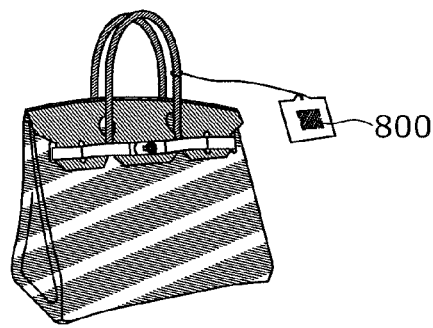
Figure 21F:
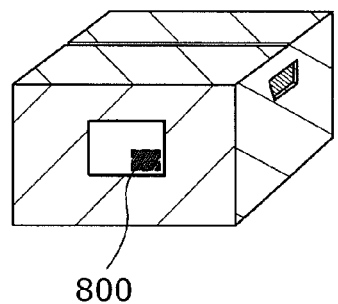

The RFID tag can be used in a wide range of fields. For example, the RFID tag 800 can be provided in objects such as bills, coins, securities, bearer bonds, documents (e.g., driver's licenses or resident's cards, see FIG. 21A), packaging containers (e.g., wrapping paper or bottles, see FIG. 21C), recording media (e.g., DVDs or video tapes, see FIG. 21B), vehicles (e.g., bicycles, see FIG. 21D), personal belongings (e.g., bags or glasses), foods, plants, animals, human bodies, clothing, household goods, medical supplies such as medicine and chemicals, and electronic devices (e.g., liquid crystal display devices, EL display devices, smartphones, cellular phones, clocks, or watches), or tags on objects (see FIGS. 21E and 21F).

The RFID tag 800 is fixed to an object by being attached to a surface of the object or being embedded in the object. For example, the RFID tag 800 is fixed to an object by being embedded in paper of a book, or embedded in an organic resin of a package. Since the RFID tag 800 can be reduced in size, thickness, and weight, it can be fixed to an object without spoiling the design of the object. When the RFID tag 800 is provided in bills, coins, securities, bearer bonds, documents, or the like, an authentication function can be provided to the objects. The use of the authentication function can prevent forgery. Furthermore, when the RFID tag 800 is attached to packaging containers, recording media, personal belongings, foods, clothing, household goods, electronic devices, or the like, a system such as an inspection system or an inventory management system can be used efficiently. When the RFID tag 800 is attached to vehicles, the level of security can be raised.

A variety of kinds of information can be obtained wirelessly by incorporating a sensor unit in the RFID tag 800. The RFID tag 800 including a temperature sensor circuit and/or a humidity sensor circuit can be used for controlling temperature and/or humidity of the cultural properties, for example.

Although the CPU and the RFID tag are described here as examples of a processing unit, the memory device of one embodiment of the present invention can be used for a variety of processing units. For example, the semiconductor memory device of one embodiment of the present invention can also be used for a graphics processing unit (GPU), a programmable logic device (PLD), a digital signal processor (DSP), a microcontroller unit (MCU), and a custom LSI.

Embodiment 5

In this embodiment, an electronic component and electronic appliances and the like including the electronic component are described as examples of a semiconductor device.

<<Example of Manufacturing Method of Electronic Component>>

Figure 22A:
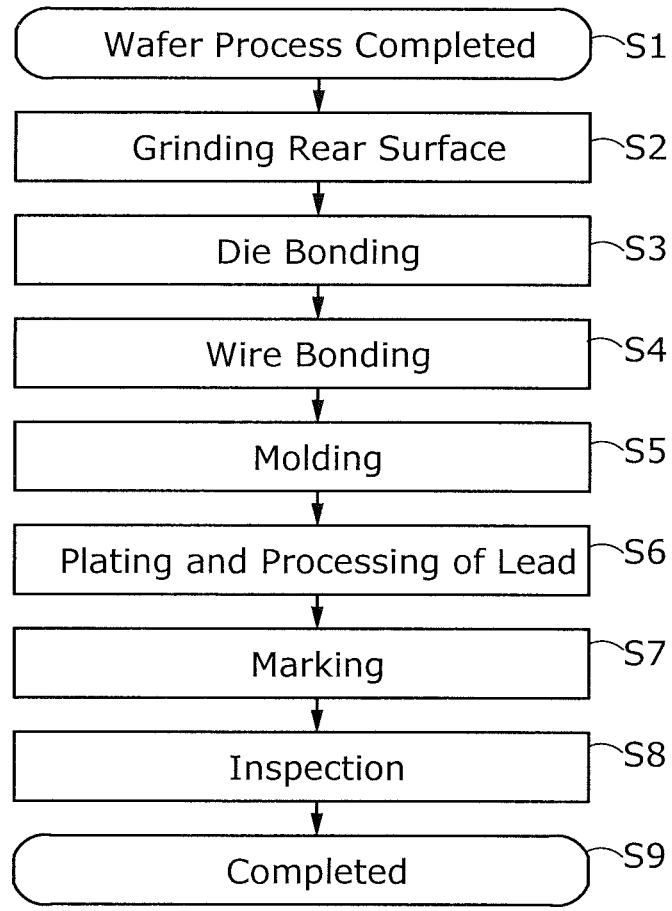
FIG. 22A is a flow chart showing an example of a method for manufacturing an electronic component.

FIG. 22A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed circuit board through the assembly process (post-process). The post-process can be finished through steps in FIG. 22A. Specifically, after an element substrate obtained in the wafer process is completed (Step S1), a rear surface of the substrate is ground (Step S2). The substrate is thinned in this step to reduce warpage or the like of the substrate in the wafer process and to reduce the size of the electronic component itself.

The rear surface of the substrate is ground so that the substrate is divided into a plurality of chips in a dicing process. Then, the divided chips are separately picked up to be mounted on and bonded to a lead frame in a die bonding step (Step S3). In this die bonding step, the chip is bonded to the lead frame by an appropriate method depending on a product, for example, bonding with a resin or a tape. Note that in the die bonding step, the chip may be mounted on an interposer to be bonded.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding step is performed to seal the wire bonded chip with an epoxy resin or the like (Step S5). With the molding step, the electronic part is filled with the resin, so that damage to a mounted circuit portion or wire due to mechanical external force can be reduced. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Next, printing (marking) is performed on a surface of the package (Step S7). Through the final inspection step (Step S8), the electronic part is completed (Step S9).

The above electronic component can include the semiconductor device described in the above embodiment. Thus, the electronic component can consume less power and have smaller size.

Figure 22B:
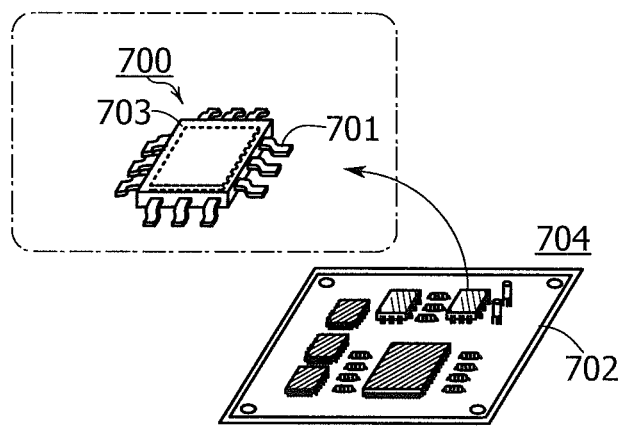
FIG. 22B is a schematic perspective view illustrating a structure example of an electronic component.

FIG. 22B is a schematic perspective view of the completed electronic component. FIG. 22B illustrates a schematic perspective view of a quad flat package (QFP) as an example of the electronic component. As illustrated in FIG. 22B, an electronic component 700 includes a lead 701 and a circuit portion 703. The electronic component 700 is mounted on a printed wiring board 702, for example. When a plurality of electronic components 700 are used in combination and electrically connected to each other over the printed wiring board 702, the electronic components 700 can be mounted on an electronic appliance. A completed circuit board 704 is provided in the electronic appliance or the like. The electronic component 700 can be used as, for example, a random access memory that stores data or a processing unit that executes a variety of types of processing, such as a microcontroller unit (MCU) or an RFID tag.

The electronic component 700 can be used as electronic component (an IC chip) of electronic appliances in a wide variety of fields, such as digital signal processing, software-defined radio systems, avionic systems (electronic appliances used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Such an electric appliance can be used for display devices, personal computers (PCs), or image reproducing devices provided with recording media (typically, devices which reproduce the content of recording media such as digital versatile discs (DVDs) and have displays for displaying the reproduced images). Other examples of the electronic appliance that can be equipped with the semiconductor device of one embodiment of the present invention are mobile phones, game machines including portable game machines, portable data appliances, e-book readers, cameras (e.g., video cameras and digital still cameras), wearable display devices or terminals (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multi-function printers, automated teller machines (ATM), and vending machines. FIGS. 23A to 23H illustrate specific examples of these electronic appliances.

<<Electronic Appliance>>

FIGS. 23A to 23F illustrate structure examples of an electronic appliance which includes a display portion and is driven by a battery.

Figure 23A:
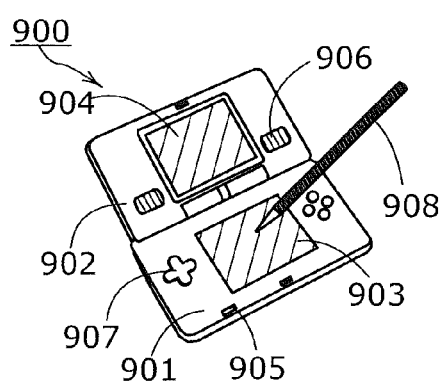
FIGS. 23A to 23H each illustrate an example of an electronic appliance.

A portable game machine 900 illustrated in FIG. 23A includes a housing 901, a housing 902, a display portion 903, a display portion 904, a microphone 905, a speaker 906, an operation key 907, and the like. The display portion 903 is provided with a touch screen as an input device, which can be handled with a stylus 908 or the like.

Figure 23B:
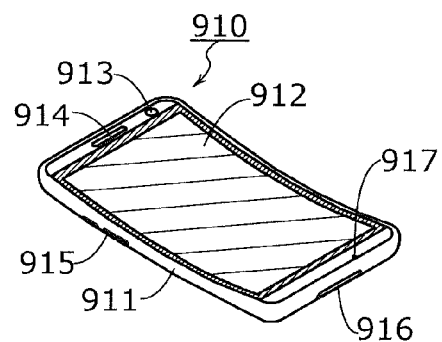

An information terminal 910 illustrated in FIG. 23B includes a housing 911, a display portion 912, a microphone 917, a speaker portion 914, a camera 913, an external connection portion 916, an operation button 915, and the like. A display panel that uses a flexible substrate and a touch screen are provided in the display portion 912. The information terminal 910 can be used as, for example, a smartphone, a mobile phone, a tablet information terminal, a tablet PC, or an e-book reader.

Figure 23C:
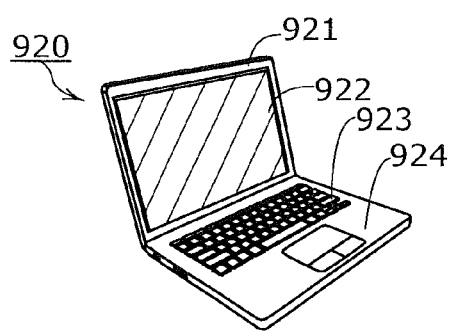

A notebook PC 920 illustrated in FIG. 23C includes a housing 921, a display portion 922, a keyboard 923, a pointing device 924, and the like.

Figure 23D:
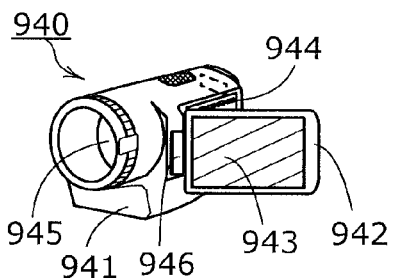

A video camera 940 illustrated in FIG. 23D includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image on the display portion 943 may be changed and display and non-display of an image may be switched depending on the angle between the housings 941 and 942.

Figure 23E:
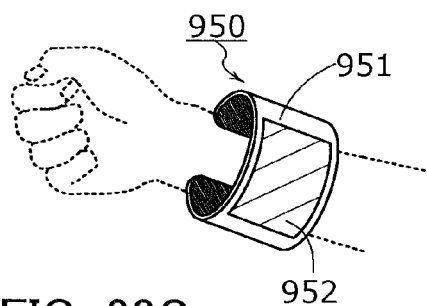

FIG. 23E illustrates an example of a bangle-type information terminal. An information terminal 950 includes a housing 951, a display portion 952, and the like. The display portion 952 is supported by the housing 951 having a curved surface. A display panel formed with a flexible substrate is provided in the display portion 952, whereby the information terminal 950 can be a user-friendly information terminal that is flexible and lightweight.

Figure 23F:
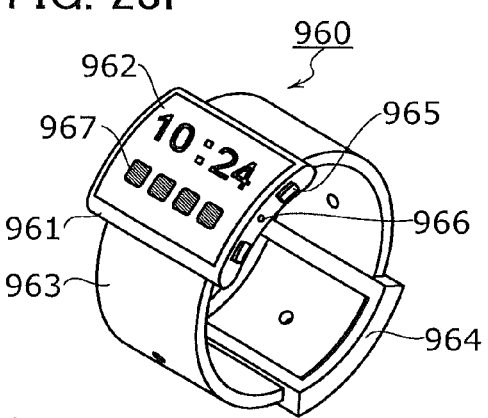

FIG. 23F illustrates an example of a watch-type information terminal. An information terminal 960 includes a housing 961, a display portion 962, a band 963, a buckle 964, an operation button 965, an input/output terminal 966, and the like. The information terminal 960 is capable of executing a variety of applications such as mobile phone calls, e-mailing, viewing and editing texts, music reproduction, Internet communication, and computer games.

The display surface of the display portion 962 is bent, and images can be displayed on the bent display surface. Further, the display portion 962 includes a touch sensor, and operation can be performed by touching the screen with a finger, a stylus, or the like. For example, by touching an icon 967 displayed on the display portion 962, an application can be started. With the operation button 965, a variety of functions such as time setting, power ON/OFF, ON/OFF of wireless communication, setting and cancellation of manner mode, and setting and cancellation of power saving mode can be performed. For example, the functions of the operation button 965 can be set by setting the operating system incorporated in the information terminal 960.

The information terminal 960 can employ near field communication that is a communication method based on an existing communication standard. In that case, for example, mutual communication between the information terminal 960 and a headset capable of wireless communication can be performed, and thus hands-free calling is possible. Moreover, the information terminal 960 includes the input/output terminal 966, and data can be directly transmitted to and received from another information terminal via a connector. Power charging through the input/output terminal 966 is possible. Note that the charging operation may be performed by wireless power feeding without using the input/output terminal 966.

Figure 23G:
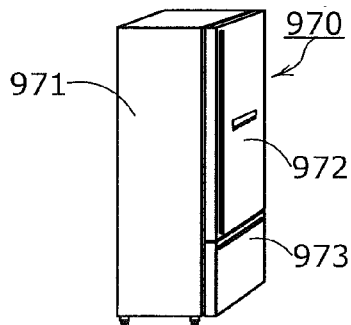

FIG. 23G illustrates an electric refrigerator-freezer as an example of a home electric appliance. An electric refrigerator-freezer 970 includes a housing 971, a refrigerator door 972, a freezer door 973, and the like.

Figure 23H:
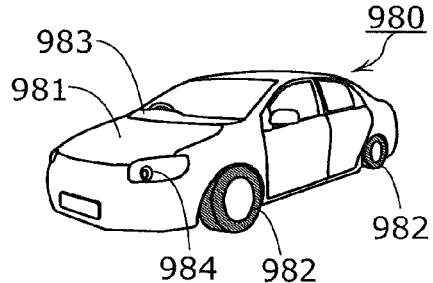

FIG. 23H is an external view illustrating a structure example of a motor vehicle. A motor vehicle 980 includes a car body 981, wheels 982, a dashboard 983, lights 984, and the like.

An electronic component including the semiconductor device described in the above embodiment is provided in the electronic appliances described in this embodiment. Thus, an electronic appliance that consumes less power and is capable of operating stably can be provided.

This application is based on Japanese Patent Application serial no. 2014-111062 filed with Japan Patent Office on May 29, 2014, the entire contents of which are hereby incorporated by reference.

What is claimed is:

1. A memory device comprising:
a first wiring;
a second wiring;
a memory cell; and
a first circuit,
wherein the memory cell comprises a first transistor and a first capacitor,
wherein the first transistor is configured to control a conduction state between the first wiring and a first terminal of the first capacitor,
wherein the first circuit comprises a second transistor and a second capacitor,
wherein the second transistor is configured to control a conduction state between the second wiring and a first terminal of the second capacitor,
wherein the first circuit is configured to determine whether a first potential of the first terminal of the second capacitor is lower than a second potential, to generate a first signal and a second signal when the first potential is determined to be lower than the second potential, to turn on the second transistor in response to the second signal, and to apply a third potential to the second wiring in response to the second signal, and
wherein the first signal is configured to start a refresh operation of the memory cell.

2. The memory device according to claim 1,
wherein the first circuit is configured to generate a third signal obtained by delaying the second signal,
wherein the first circuit inputs the third signal to the second wiring, and
wherein the first circuit inputs the second signal to a gate of the second transistor.

3. The memory device according to claim 1,
wherein the first circuit comprises an amplifier circuit and a switch,
wherein the amplifier circuit is configured to amplify a difference between the first potential and the second potential,
wherein the amplifier circuit comprises a third transistor,
wherein the third transistor is configured a current source,
wherein the switch is configured to control a conduction state between a wiring being configured to supply a fourth potential and the amplifier circuit, and
wherein the first circuit causes the switch to be on in a period in which the third transistor is off.

4. The memory device according to claim 1, wherein a channel of each of the first and second transistors is formed using an oxide semiconductor.

5. The memory device according to claim 4, wherein the oxide semiconductor comprises a crystal part with c-axis alignment.

6. The memory device according to claim 1, further comprising a third wiring,
wherein the third wiring is electrically connected to the first transistor.

7. A memory device comprising:
a first wiring;
a second wiring;
a memory cell; and
a first circuit,
wherein the memory cell comprises a first transistor and a first capacitor,
wherein the first transistor is configured to control a conduction state between the first wiring and a first terminal of the first capacitor,
wherein the first circuit comprises a second transistor and a second capacitor,
wherein the second transistor is configured to control a conduction state between the second wiring and a first terminal of the second capacitor,
wherein the first circuit is configured to determine whether a first potential of the first terminal of the second capacitor is lower than a second potential, to generate a first signal and a second signal when the first potential is determined to be lower than the second potential, to turn on the second transistor in response to the second signal, and to apply a third potential to the second wiring in response to the second signal,
wherein the first signal is configured to start a refresh operation of the memory cell,
wherein the first circuit is configured to generate a third signal obtained by delaying the second signal,
wherein the first circuit inputs the third signal to the second wiring, and
wherein the first circuit inputs the second signal to a gate of the second transistor,
wherein the first circuit comprises an amplifier circuit and a switch, wherein the amplifier circuit is configured to amplify a difference between the first potential and the second potential, wherein the amplifier circuit comprises a third transistor, wherein the third transistor is configured a current source, wherein the switch is configured to control a conduction state between a wiring being configured to supply a fourth potential and the amplifier circuit, and wherein the first circuit causes the switch to be on in a period in which the third transistor is off.

8. The memory device according to claim 7, wherein a channel of each of the first and second transistors is formed using an oxide semiconductor.

9. The memory device according to claim 8, wherein the oxide semiconductor comprises a crystal part with c-axis alignment.

10. The memory device according to claim 7, further comprising a third wiring, wherein the third wiring is electrically connected to the first transistor.

11. A memory device comprising:

a memory cell array comprising:

a plurality of first wirings;

a plurality of memory cells; and a plurality of first circuits, a second wiring, wherein each of the plurality of memory cells comprises a first transistor and a first capacitor, wherein the first transistor is configured to control a conduction state between one of the plurality of first wirings and a first terminal of the first capacitor, wherein each of the plurality of the first circuit comprises a second transistor and a second capacitor, wherein the second transistor is configured to control a conduction state between the second wiring and a first terminal of the second capacitor, wherein each of the plurality of the first circuit is configured to determine whether a first potential of the first terminal of the second capacitor is lower than a second potential, to generate a first signal and a second signal when the first potential is determined to be lower than the second potential, to turn on the second transistor in response to the second signal, and to apply a third potential to the second wiring in response to the second signal, and wherein the first signal is configured to start a refresh operation of one of the plurality of memory cells.

12. The memory device according to claim 11, wherein the memory cell array comprises a plurality of banks, wherein each of the plurality of banks comprise one of the plurality of first circuits, and wherein the first signal generated in one of the plurality of first circuits is configured to start a refresh operation of a corresponding one of the plurality of banks.

13. The memory device according to claim 12, wherein each of the plurality of banks comprises a plurality of blocks, wherein each of the plurality of blocks each comprises one of the plurality of the first circuit, and wherein the first signal generated in one of the plurality of first circuits is configured to start a refresh operation of a corresponding one of the plurality of blocks.

14. The memory device according to claim 13, wherein one of the plurality of memory cells electrically connected to a corresponding one of the plurality of first wirings.

15. The memory device according to claim 11, further comprising a plurality of third wirings, wherein one of the plurality of third wirings is electrically connected to the first transistor.

* * * * *